United States Patent
Tran et al.

(10) Patent No.: US 10,720,217 B1
(45) Date of Patent: Jul. 21, 2020

(54) MEMORY DEVICE AND METHOD FOR VARYING PROGRAM STATE SEPARATION BASED UPON FREQUENCY OF USE

(71) Applicant: Silicon Storage Technology, Inc., San Jose, CA (US)

(72) Inventors: Hieu Van Tran, San Jose, CA (US); Steven Lemke, Boulder Creek, CA (US); Vipin Tiwari, Dublin, CA (US); Nhan Do, Saratoga, CA (US); Mark Reiten, Alamo, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/382,060

(22) Filed: Apr. 11, 2019

Related U.S. Application Data

(60) Provisional application No. 62/798,417, filed on Jan. 29, 2019.

(51) Int. Cl.
| | |
|---|---|
| *G11C 16/04* | (2006.01) |
| *G11C 16/26* | (2006.01) |
| *G11C 16/10* | (2006.01) |
| *G11C 11/54* | (2006.01) |
| *G06N 3/04* | (2006.01) |
| *G11C 14/00* | (2006.01) |
| *H01L 27/11521* | (2017.01) |

(52) U.S. Cl.
CPC ........... *G11C 16/10* (2013.01); *G06N 3/0454* (2013.01); *G11C 11/54* (2013.01); *G11C 14/00* (2013.01); *G11C 16/0425* (2013.01); *G11C 16/26* (2013.01); *H01L 27/11521* (2013.01)

(58) Field of Classification Search
CPC .... G06N 3/0454; G06N 3/063; G06N 3/0445; G11C 11/54; G11C 16/0433; G11C 16/045; G11C 16/08; G11C 16/10; G11C 16/14; G11C 16/16; G11C 16/24; G11C 16/26; G11C 16/28
See application file for complete search history.

(56) References Cited

U.S. PATENT DOCUMENTS

| | | | |
|---|---|---|---|
| 4,810,910 | A | 3/1989 | Schoellikopf |
| 4,961,002 | A | 10/1990 | Tam et al. |
| 5,029,130 | A | 7/1991 | Yeh |

(Continued)

FOREIGN PATENT DOCUMENTS

| | | |
|---|---|---|
| EP | 0566739 A1 | 10/1993 |
| EP | 0562737 B1 | 6/1998 |

OTHER PUBLICATIONS

U.S. Appl. No. 16/382,013 entitled "Neural Network Classifier Using Array of Two-Gate Non-volatile Memory Cells," Tran, et al, filed Apr. 11, 2019.

(Continued)

*Primary Examiner* — Hien N Nguyen
(74) *Attorney, Agent, or Firm* — DLA Piper LLP (US)

(57) ABSTRACT

A memory device includes a plurality of memory cells and a controller. The controller is configured to program each of the memory cells to one of a plurality of program states, and to read the memory cells using a read operation of applied voltages to the memory cells. During the read operation, separations between adjacent ones of the program states vary based on frequencies of use of the program states in the plurality of memory cells.

27 Claims, 39 Drawing Sheets

(56) References Cited

U.S. PATENT DOCUMENTS

| | | | |
|---|---|---|---|
| 5,097,441 A | 3/1992 | Soon-In et al. | |
| 5,138,576 A | 8/1992 | Madurawe | |
| 5,146,602 A | 9/1992 | Holler | |
| 5,256,911 A | 10/1993 | Holler | |
| 5,264,734 A | 11/1993 | Holler | |
| 5,336,936 A | 8/1994 | Allen et al. | |
| 5,386,132 A | 1/1995 | Wong | |
| 5,469,397 A | 11/1995 | Hoshino | |
| 5,554,874 A | 9/1996 | Doluca | |
| 5,621,336 A | 4/1997 | Shibata et al. | |
| 5,643,814 A | 7/1997 | Chung | |
| 5,721,702 A | 2/1998 | Briner | |
| 5,914,894 A | 6/1999 | Diorio | |
| 6,222,777 B1 | 4/2001 | Khieu | |
| 6,683,645 B1 | 1/2004 | Collins et al. | |
| 6,747,310 B2 | 6/2004 | Fan et al. | |
| 6,829,598 B2 | 12/2004 | Milev | |
| 7,315,056 B2 | 1/2008 | Klinger et al. | |
| 7,868,375 B2 | 1/2011 | Liu et al. | |
| 10,522,226 B2 * | 12/2019 | Tran | G06N 3/08 |
| 10,534,840 B1 * | 1/2020 | Petti | G11C 11/54 |
| 2002/0089014 A1 | 7/2002 | Chern | |
| 2003/0034510 A1 | 2/2003 | Liu | |
| 2003/0183871 A1 | 10/2003 | Dugger et al. | |
| 2004/0095809 A1 | 5/2004 | Sakamoto | |
| 2004/0125655 A1 | 7/2004 | Tsai | |
| 2004/0156241 A1 | 8/2004 | Mokhlesi | |
| 2005/0087892 A1 | 4/2005 | Hsu | |
| 2006/0104120 A1 | 5/2006 | Hemink | |
| 2006/0170038 A1 | 8/2006 | Wong | |
| 2007/0171756 A1 | 7/2007 | Lambrache | |
| 2009/0103361 A1 | 4/2009 | Wang | |
| 2009/0109760 A1 | 4/2009 | Nazarian | |
| 2010/0046299 A1 | 2/2010 | Roohparvar | |
| 2010/0290292 A1 | 11/2010 | Tanizaki | |
| 2012/0087188 A1 | 4/2012 | Hsieh et al. | |
| 2013/0044544 A1 | 2/2013 | Shiino | |
| 2013/0100756 A1 | 4/2013 | Liao et al. | |
| 2014/0054667 A1 | 2/2014 | Tkachev | |
| 2014/0269062 A1 | 9/2014 | Do | |
| 2014/0310220 A1 | 10/2014 | Chang | |
| 2015/0106315 A1 | 4/2015 | Birdwell | |
| 2015/0213898 A1 | 7/2015 | Do | |
| 2015/0262055 A1 | 9/2015 | Akopyan | |
| 2016/0034812 A1 * | 2/2016 | Gibson | G06N 3/08 706/25 |
| 2016/0042790 A1 | 2/2016 | Tran | |
| 2016/0093382 A1 | 3/2016 | Sakamoto | |
| 2016/0133639 A1 | 5/2016 | Tran | |
| 2016/0180945 A1 | 6/2016 | Ng | |
| 2016/0254269 A1 | 9/2016 | Kim et al. | |
| 2017/0083810 A1 * | 3/2017 | Ielmini | G06N 3/049 |
| 2017/0091616 A1 * | 3/2017 | Gokmen | G06N 3/0635 |
| 2017/0193353 A1 * | 7/2017 | Lee | G06N 3/049 |
| 2017/0337466 A1 | 11/2017 | Bayat | |
| 2017/0337971 A1 | 11/2017 | Tran et al. | |
| 2017/0337980 A1 | 11/2017 | Guo et al. | |
| 2018/0004708 A1 | 1/2018 | Muralimanohar | |
| 2018/0040367 A1 * | 2/2018 | Wu | F01D 17/085 |
| 2018/0268912 A1 | 9/2018 | Guo et al. | |
| 2018/0293487 A1 | 10/2018 | Copel et al. | |
| 2019/0088325 A1 | 3/2019 | Tiwari et al. | |

OTHER PUBLICATIONS

U.S. Appl. No. 16/382,034 entitled "Neural Network Classifier Using Array of Three-Gate Non-volatile Memory Cells," Tran, et al, filed Apr. 11, 2019.

U.S. Appl. No. 16/382,045 entitled "Neural Network Classifier Using Array of Three-Gate Non-volatile Memory Cells," Tran, et al, filed Apr. 11, 2019.

U.S. Appl. No. 16/382,051 entitled "Neural Network Classifier Using Array of Stacked Gate Non-volatile Memory Cells," Tran, et al, filed Apr. 11, 2019.

U.S. Appl. No. 15/826,345 entitled "High Precision and Highly Efficient Tuning Mechanisms . . . Network," Tran, et al., filed Nov. 29, 2017.

U.S. Appl. No. 16/271,673 entitled "Flash Memory Array With Individual Memory Cell Read, Program and Erase," Guo et al., filed Feb. 8, 2019.

U.S. Appl. No. 15/991,890 entitled "Decoders for Analog Neural Memory in Deep Learning Artificial Neural Network," Tran, et al., filed May 29, 2018.

U.S. Appl. No. 16/353,830 entitled "System for Converting Neuron Current Into Neuron Current-Based Time Pulses . . . Network," Tran et al., filed Mar. 14, 2019.

U.S. Appl. No. 16/503,355, filed Jul. 3, 2019, Tran et al.

U.S. Appl. No. 16/354,04, filed Mar. 14, 2019, Tran et al.

U.S. Appl. No. 16/353,409, titled "Apparatus and Method for Combining Analog Neural Net With FPGA Routing in a Monolithic Integrated Circuit," filed Mar. 14, 2019.

U.S. Appl. No. 62/797,158, titled "Apparatus and Method for Combining Analog Neural Net With FPGA Routing in a Monolithic Integrated Circuit," filed Jan. 25, 2019.

Jenn-Chyou Bor, et al., "Realization of the CMOS Pulsewidth-Modulation (PWM) Neural Network with on-Chip Learning," IEEE Transactions on Circuits and Systems, Jan. 1998.

Alister Hamilton, et al., "Integrated Pulse Stream Neural Networks: Results, Issues, and Pointers," IEEE Transactions on Neural Networks, May 1992.

Shafiee et al, "Isaac: A Convolution Neural Network Accelerator With in-Situ Analog Arithmetic in Crossbars;" 2016 ACM/IEEE 43rd Anual International Symposium on Computer Architecture, Seoul, Oct. 2016. [URL:https://www.cs.utah.edu/-rajeev/pubs/isca16.pdf; pp. 1-4].

* cited by examiner

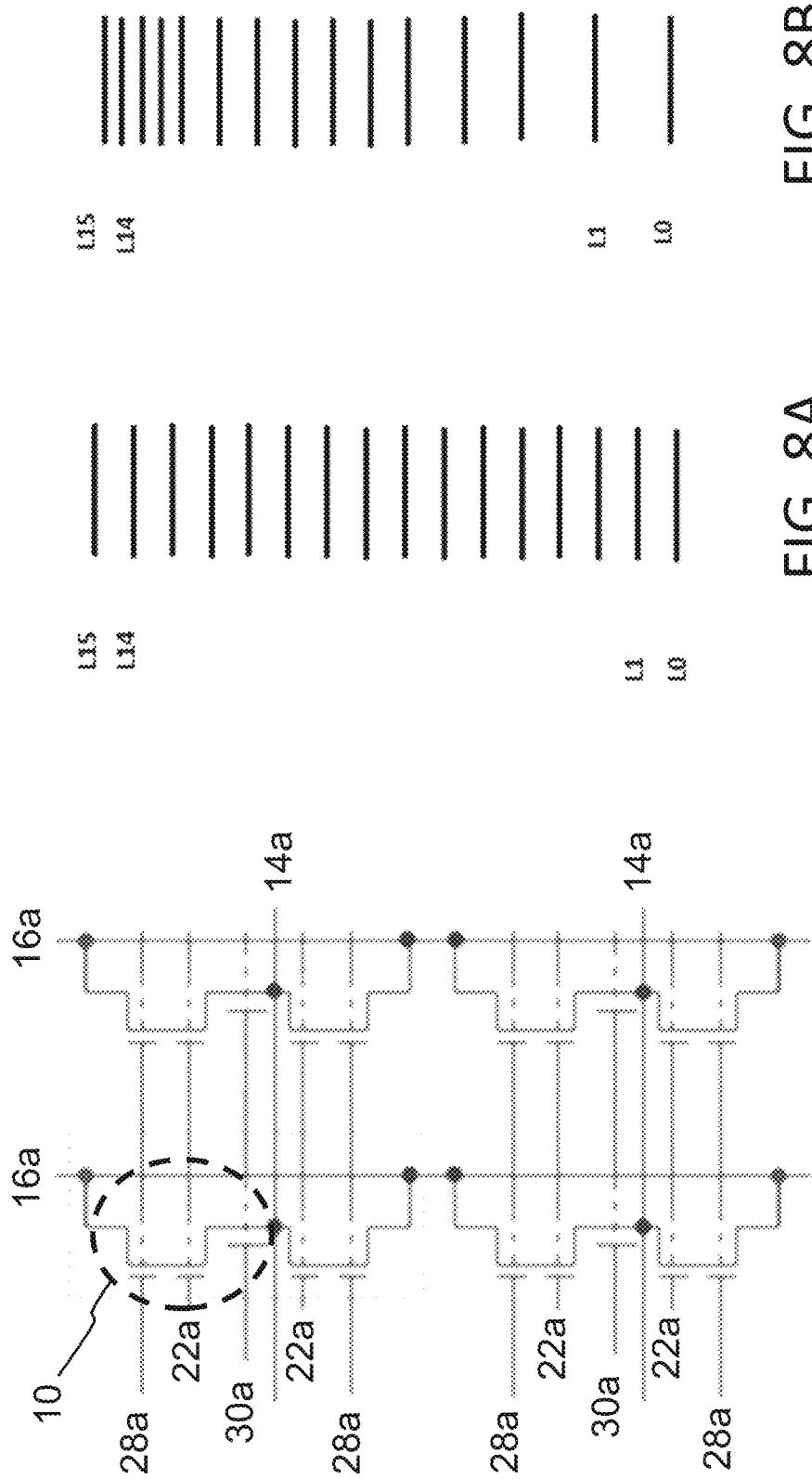

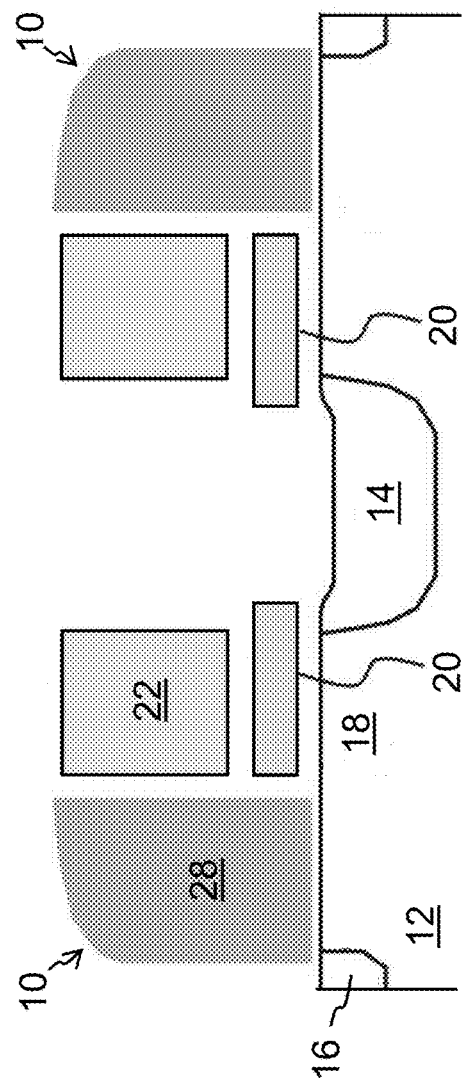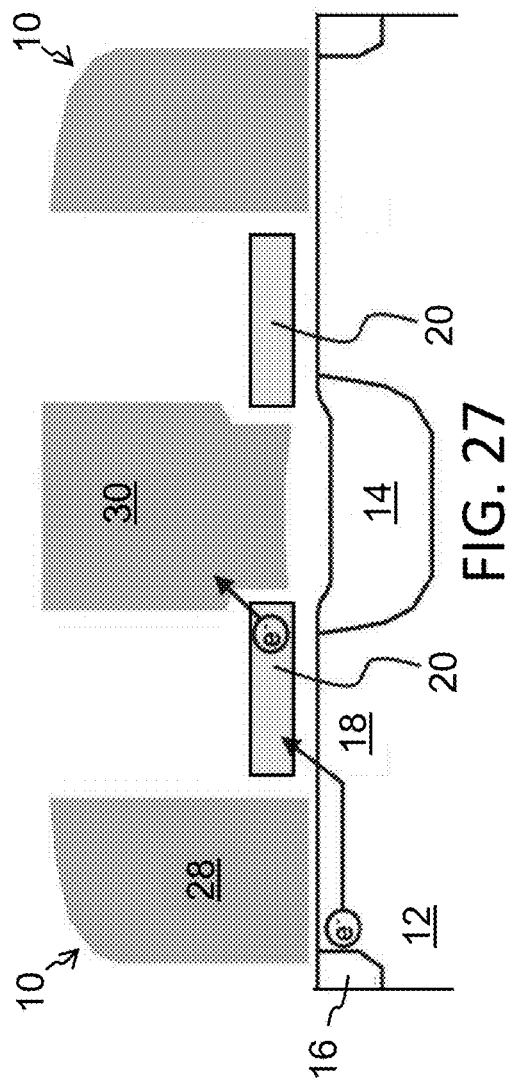

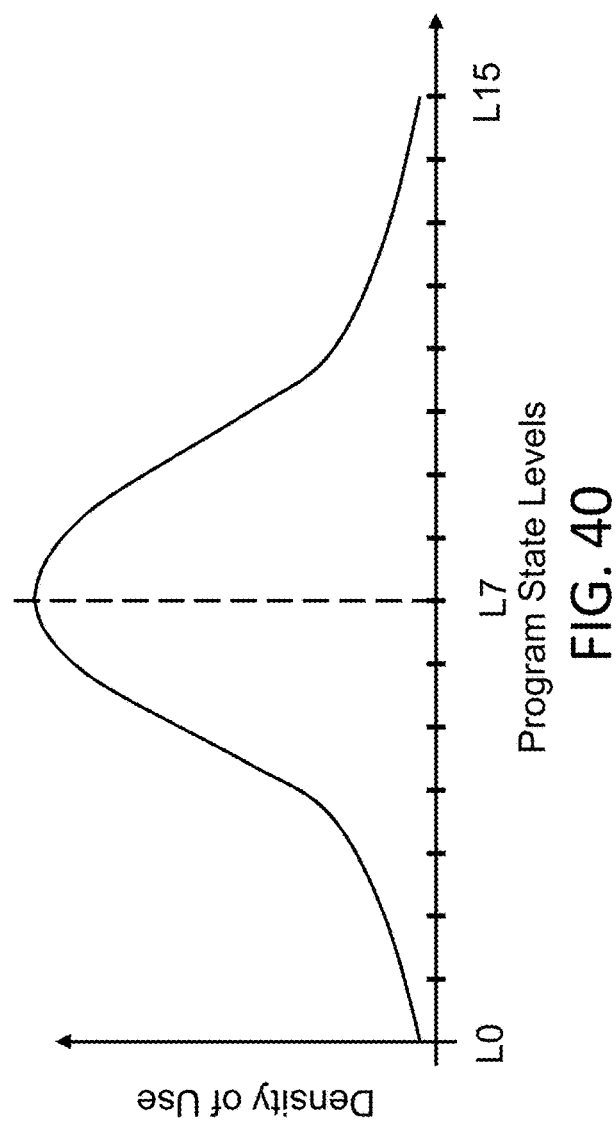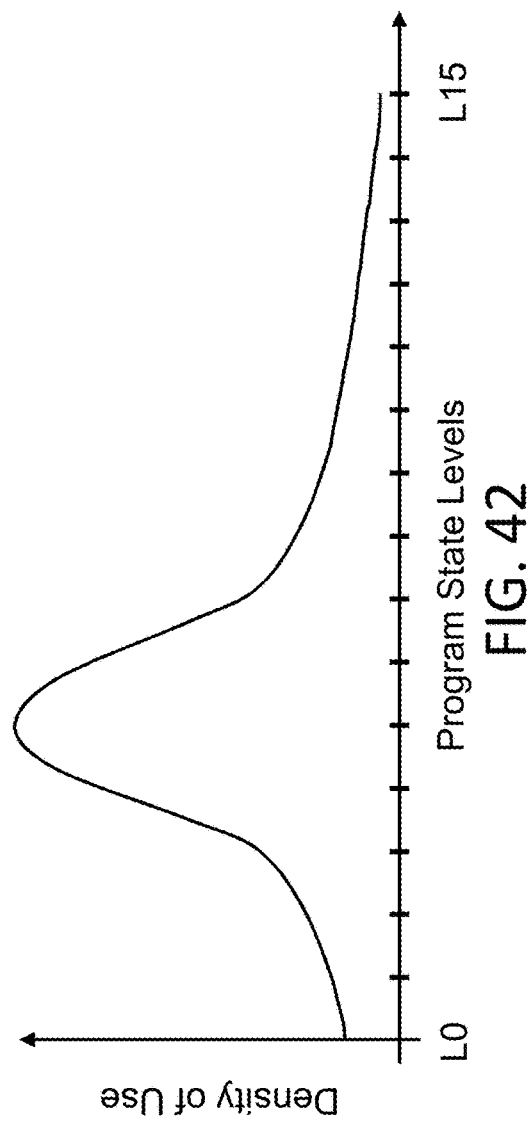

MEMORY DEVICE AND METHOD FOR VARYING PROGRAM STATE SEPARATION BASED UPON FREQUENCY OF USE

RELATED APPLICATIONS

This application claims the benefit of U.S. Provisional Application No. 62/798,417, filed Jan. 29, 2019.

FIELD OF THE INVENTION

The present invention relates to neural networks.

BACKGROUND OF THE INVENTION

Artificial neural networks mimic biological neural networks (the central nervous systems of animals, in particular the brain) which are used to estimate or approximate functions that can depend on a large number of inputs and are generally known. Artificial neural networks generally include layers of interconnected "neurons" which exchange messages between each other. FIG. 1 illustrates an artificial neural network, where the circles represent the inputs or layers of neurons. The connections (called synapses) are represented by arrows, and have numeric weights that can be tuned based on experience. This makes neural nets adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

BRIEF SUMMARY OF THE INVENTION

The aforementioned problems and needs are addressed by a memory device that includes a plurality of memory cells and a controller. The controller is configured to program each of the memory cells to one of a plurality of program states, read the memory cells using a read operation of applied voltages to the memory cells, wherein during the read operation, separations between adjacent ones of the program states vary based on frequencies of use of the program states in the plurality of memory cells.

A neural network device includes a first plurality of synapses configured to receive a first plurality of inputs and to generate therefrom a first plurality of outputs. The first plurality of synapses includes a plurality of memory cells and a controller. The controller is configured to program each of the memory cells to one of a plurality of program states, read the memory cells using a read operation of applied voltages to the memory cells, wherein during the read operation, separations between adjacent ones of the program states vary based on frequencies of use of the program states in the plurality of memory cells. The plurality of memory cells are configured to generate the first plurality of outputs based upon the first plurality of inputs and the plurality of program states. A first plurality of neurons is configured to receive the first plurality of outputs.

A method of programming memory cells includes programming each of a plurality of memory cells to one of a plurality of program states, reading the memory cells using a read operation of applied voltages to the memory cells, determining a frequency of use for each of the program states in the plurality of memory cells, and for each of the program states, setting a separation between the program state and an adjacent one of the program states during the read operation based upon the determined frequency of use for the program state.

A neural network device includes first and second pluralities of synapses and first and second pluralities of neurons. The first plurality of synapses is configured to receive a first plurality of inputs and to generate therefrom a first plurality of outputs, wherein the first plurality of synapses includes a plurality of first memory cells and a controller configured to program each of the first memory cells to one of a plurality of first program states, and read the first memory cells using a read operation of applied voltages to the first memory cells. The plurality of first memory cells are configured to generate the first plurality of outputs based upon the first plurality of inputs and the plurality of first program states. The first plurality of neurons is configured to receive the first plurality of outputs. The second plurality of synapses is configured to receive a second plurality of inputs from the first plurality of neurons and to generate therefrom a second plurality of outputs. The second plurality of synapses includes a plurality of second memory cells, and the controller is configured to program each of the second memory cells to one of a plurality of second program states, and read the second memory cells using a second read operation of second applied voltages to the second memory cells. The plurality of second memory cells are configured to generate the second plurality of outputs based upon the second plurality of inputs and the plurality of second program states. The second plurality of neurons is configured to receive the second plurality of outputs. Wherein the neural network device is further characterized by at least one of the following:

- a total number of the plurality of first program states is different than a total number of the plurality of second program states,
- a total number of the plurality of first program states is only two and a total number of the plurality of second program states greater than two, or a total number of the plurality of first program states is greater than two and a total number of the plurality of second program states only two,
- the first memory cells are volatile and the second memory cells are non-volatile, or the first memory cells are non-volatile and the second memory cells are volatile,
- the first memory cells and the second memory cells are non-volatile,
- the controller is configured perform the first read operation above threshold and the second read operation below threshold, or perform the first read operation below threshold and the second read operation above threshold, and the controller is configured perform the first read operation and the second read operation above threshold, or perform the first read operation and the second read operation below threshold.

Other objects and features of the present invention will become apparent by a review of the specification, claims and appended figures.

BRIEF DESCRIPTION OF THE DRAWINGS

FIG. 7 is a diagram illustrating a conventional array architecture for the memory cell of FIG. 6.

FIG. 8A is a diagram illustrating neural network weight level assignments that are evenly spaced.

FIG. 8B is a diagram illustrating neural network weight level assignments that are unevenly spaced.

FIG. 25 is a side cross sectional view of a 3-gate non-volatile memory cell.

FIG. 27 is a side cross sectional view of a 3-gate non-volatile memory cell.

FIGS. 40, 42, 44 and 46 are graphs illustrating density of use as a function of program state levels.

DETAILED DESCRIPTION OF THE INVENTION

Figure 2:
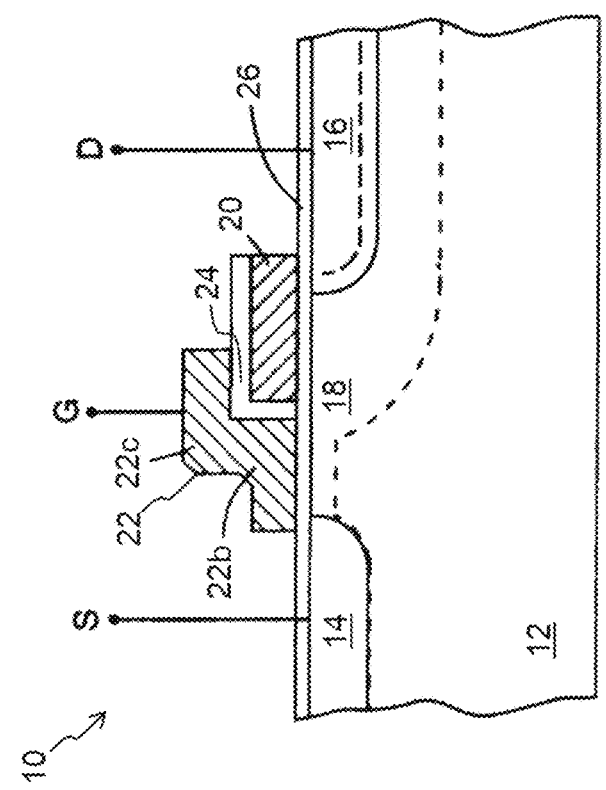
FIG. 2 is a side cross sectional view of a conventional 2-gate non-volatile memory cell.
Figure 1:
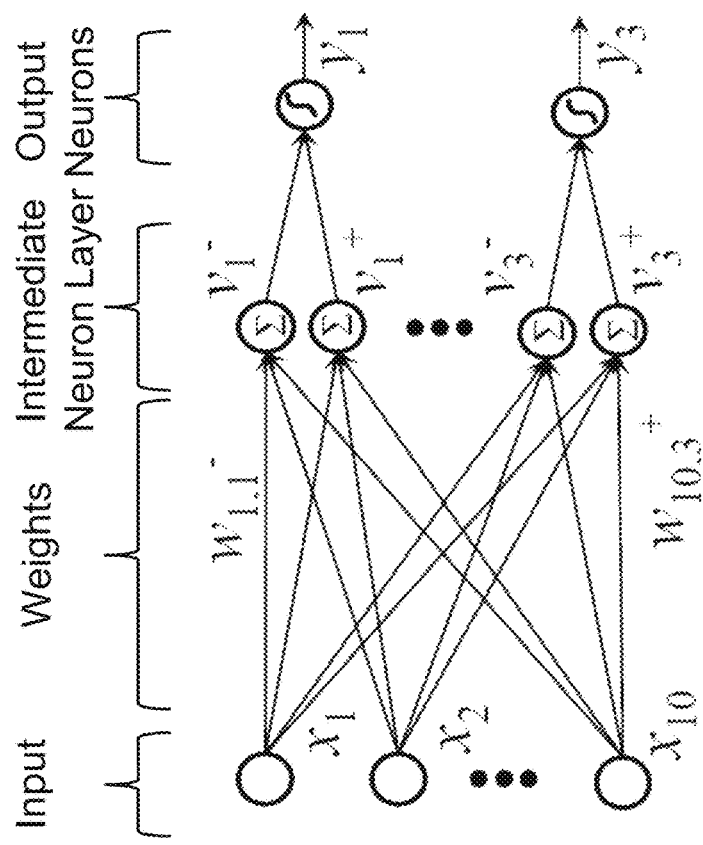
FIG. 1 is a diagram that illustrates an artificial neural network.

The artificial neural networks of the present invention utilize a combination of CMOS technology and non-volatile memory arrays. Digital non-volatile memories are well known. For example, U.S. Pat. No. 5,029,130 ("the '130 patent") discloses an array of split gate non-volatile memory cells, and is incorporated herein by reference for all purposes. The memory cell disclosed in the '130 patent is shown in FIG. 2 as memory cell 10. Each memory cell 10 includes source and drain regions 14/16 formed in a semiconductor substrate 12, with a channel region 18 there between. A floating gate 20 is formed over and insulated from (and controls the conductivity of) a first portion of the channel region 18, and over a portion of the drain region 16. A control gate 22 (i.e., a second, channel controlling gate) has a first portion 22b that is disposed over and insulated from (and controls the conductivity of) a second portion of the channel region 18, and a second portion 22c that extends up and over the floating gate 20. The floating gate 20 and control gate 22 are insulated from the substrate 12 by a gate oxide 26.

The memory cell 10 is erased (where electrons are removed from the floating gate 20) by placing a high positive voltage on the control gate 22, which causes electrons on the floating gate 20 to tunnel through an intermediate insulation 24 from the floating gate 20 to the control gate 22 via Fowler-Nordheim tunneling.

The memory cell 10 is programmed (where electrons are placed on the floating gate 20) by placing a positive voltage on the control gate 22, and a positive voltage on the drain 16. Electron current will flow from the source 14 towards the drain 16. The electrons will accelerate and become heated when they reach the gap between the control gate 22 and the floating gate 20. Some of the heated electrons will be injected through the gate oxide 26 onto the floating gate 20 due to the attractive electrostatic force from the floating gate 20.

The memory cell 10 is read by placing positive read voltages on the drain 16 and control gate 22 (which turns on the portion of the channel region under the control gate). If the floating gate 20 is positively charged (i.e. erased of electrons and capacitively coupled to a positive voltage on the drain 16), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region 18 under the floating gate 20 is mostly or entirely turned off, and current will not flow (or there will be little flow) across the channel region 18, which is sensed as the programmed or "0" state.

Figure 3:
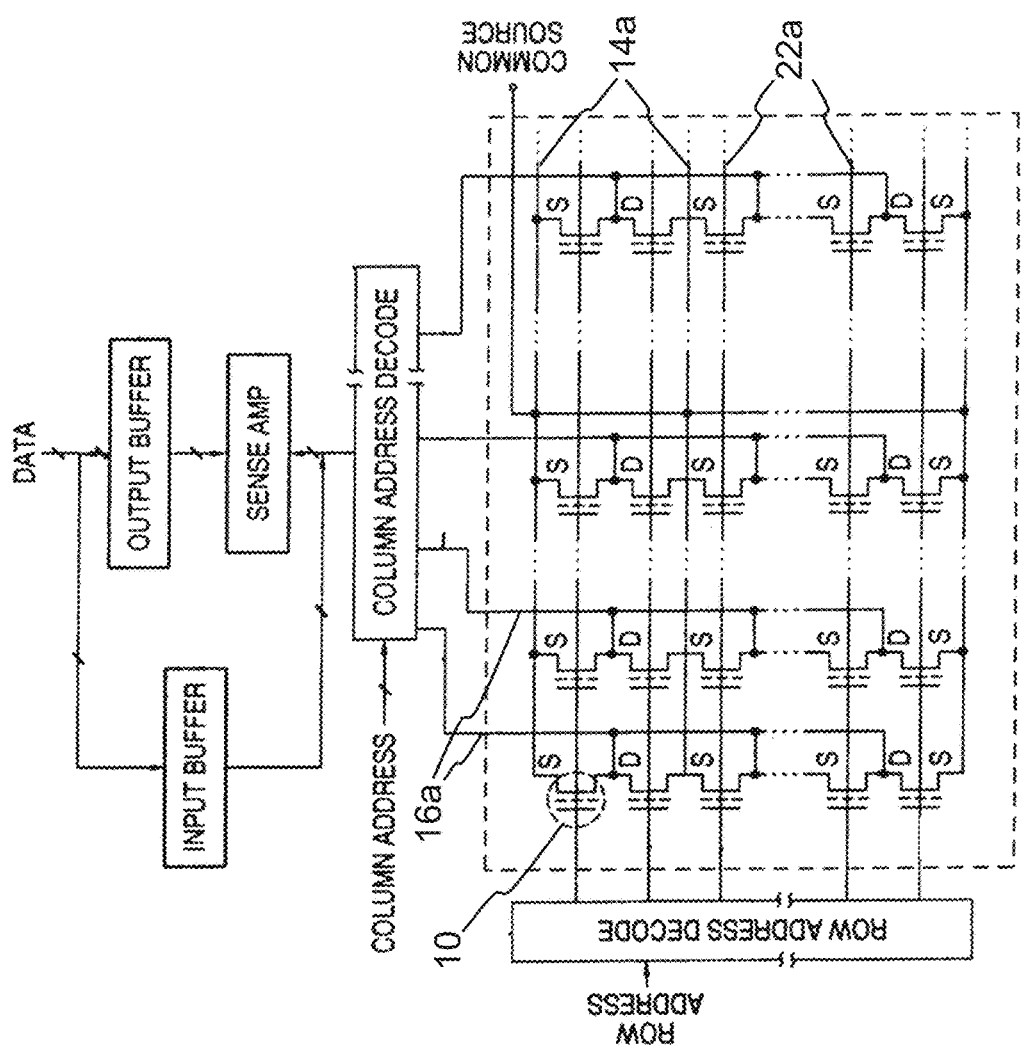
FIG. 3 is a diagram illustrating a conventional array architecture for the memory cell of FIG. 2.

The architecture of a conventional array architecture for the memory cell 10 is shown in FIG. 3. The memory cells 10 are arranged in rows and columns. In each column, the memory cells are arranged end to end in mirror fashion, so that they are formed as pairs of memory cells each sharing a common source region 14 (S), and each adjacent set of memory cell pairs sharing a common drain region 16 (D). All the source regions 14 for any given row of memory cells are electrically connected together by a source line 14a. All the drain regions 16 for any given column of memory cells are electrically connected together by a bit line 16a. All the control gates 22 for any given row of memory cells are electrically connected together by a control gate line 22a. Therefore, while the memory cells can be individually programmed and read, memory cell erasure is performed row by row (each row of memory cells is erased together, by the application of a high voltage on the control gate line 22a). If a particular memory cell is to be erased, all the memory cells in the same row are also erased.

Figure 5:
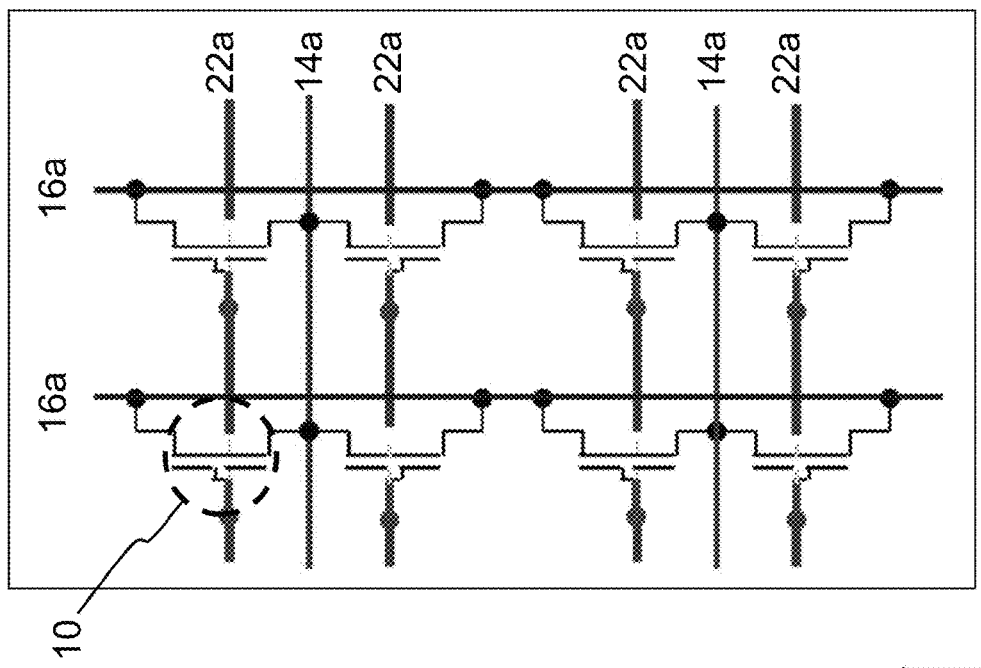
FIG. 5 is a diagram illustrating a conventional array architecture for the memory cell of FIG. 4.
Figure 4:
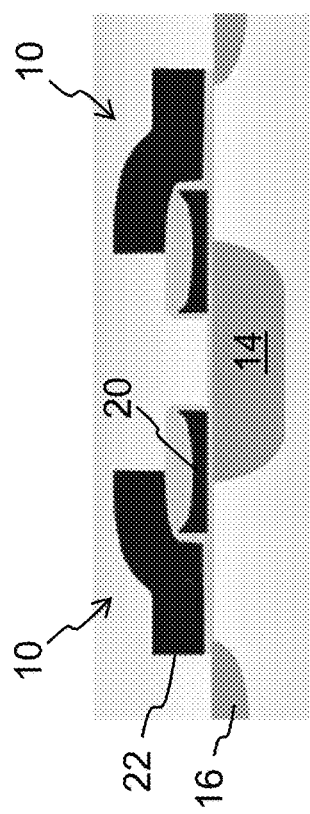
FIG. 4 is a side cross sectional view of a conventional 2-gate non-volatile memory cell.

Those skilled in the art understand that the source and drain can be interchangeable, where the floating gate 20 can extend partially over the source 14 instead of the drain 16, as shown in FIG. 4. FIG. 5 best illustrates the corresponding memory cell architecture, including the memory cells 10, the source lines 14a, the bit lines 16a, and the control gate lines 22a. As is evident from the figures, memory cells 10 of the same row share the same source line 14a and the same control gate line 22a, while the drain regions of all cells of the same column are electrically connected to the same bit line 16a. The array design is optimized for digital applications, and permits individual programming of the selected cells, e.g., by applying 1.6 V and 7.6 V to the selected control gate line 22a and source line 14a, respectively, and grounding the selected bit line 16a. Disturbing the non-selected memory cell in the same pair is avoided by applying a voltage greater than 2 volts on the unselected bit lines 16a and grounding the remaining lines. The memory cells 10 cannot be erased individually because the process responsible for erasure (the Fowler-Nordheim tunneling of electrons from the floating gate 20 to the control gate 22) is only weakly affected by the drain voltage (i.e., the only voltage which may be different for two adjacent cells in the row direction sharing the same source line 14a). A non-limiting example of operational voltages can include:

TABLE 1

|  | CG 22a | BL 16a | SL 14a |
| --- | --- | --- | --- |
| Read 1 | 0.5-3 V | 0.1-2 V | 0 V |
| Read 2 | 0.5-3 V | 0-2 V | 2-0.1 V |
| Erase | ~11-13 V | 0 V | 0 V |
| Program | 1-2 V | 1-3 uA | 9-10 V |

Read 1 is a read mode in which the cell current comes out on the bit line. Read 2 is a read mode in which the cell current comes out on the source line.

Figure 6:
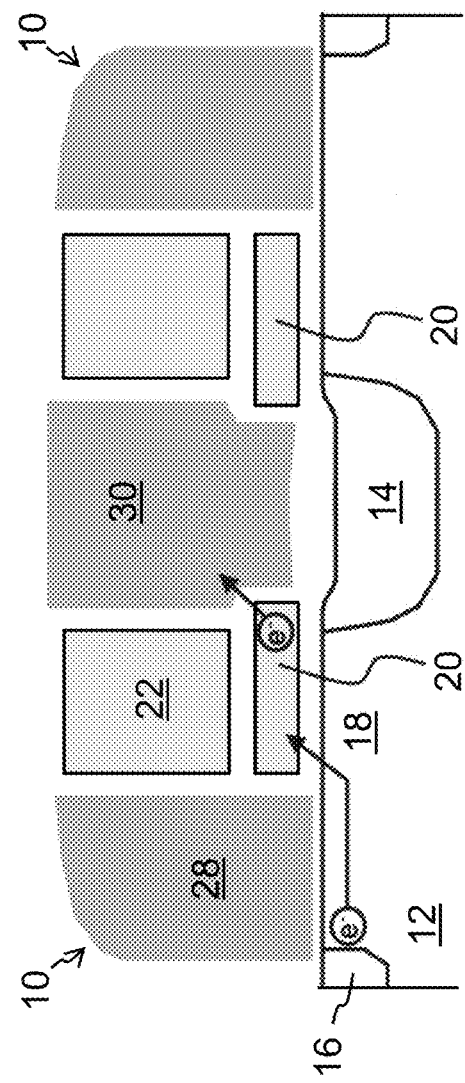
FIG. 6 is a side cross sectional view of a conventional 4-gate non-volatile memory cell.

Split gate memory cells having more than two gates are also known. For example, memory cells having source region 14, drain region 16, floating gate 20 over a first portion of channel region 18, a select gate 28 (i.e., a second, channel controlling gate) over a second portion of the channel region 18, a control gate 22 over the floating gate 20, and an erase gate 30 over the source region 14 are known, as shown in FIG. 6 (see for example U.S. Pat. No. 6,747,310, which is incorporated herein by reference for all purposes). Here, all gates are non-floating gates except floating gate 20, meaning that they are electrically connected or connectable to a voltage or current source. Programming is shown by heated electrons from the channel region 18 injecting themselves onto the floating gate 20. Erasing is shown by electrons tunneling from the floating gate 20 to the erase gate 30.

The architecture for a four-gate memory cell array can be configured as shown in FIG. 7. In this embodiment, each horizontal select gate line 28a electrically connects together all the select gates 28 for that row of memory cells. Each horizontal control gate line 22a electrically connects together all the control gates 22 for that row of memory cells. Each horizontal source line 14a electrically connects together all the source regions 14 for two rows of memory cells that share the source regions 14. Each bit line 16a electrically connects together all the drain regions 16 for that column of memory cells. Each erase gate line 30a electrically connects together all the erase gates 30 for two rows of memory cells that share the erase gate 30. As with the previous architecture, individual memory cells can be independently programmed and read. However, there is no way to erase memory cells individually. Erasing is performed by placing a high positive voltage on the erase gate line 30a, which results in the simultaneous erasing of both rows of the memory cells that share the same erase gate line 30a. Exemplary, non-limiting operating voltages can include those in Table 2 below (in this embodiment, select gate lines 28a can be referred to as word lines WL):

TABLE 2

|  | SG 28a | BL 16a | CG 22a | EG 30a | SL 14a |
| --- | --- | --- | --- | --- | --- |
| Read 1 | 0.5-2 V | 0.1-2 V | 0-2.6 V | 0-2.6 V | 0 V |
| Read 2 | 0.5-2 V | 0-2 V | 0-2.6 V | 0-2.6 V | 2-0.1 V |
| Erase | −0.5 V/0 V | 0 V | 0 V/−8 V | 8-12 V | 0 V |
| Program | 1 V | 1 uA | 8-11 V | 4.5-5 V | 4.5-5 V |

Read 1 is a read mode in which the cell current comes out on the bit line. Read 2 is a read mode in which the cell current comes out on the source line.

In order to utilize the above described non-volatile memory arrays in neural networks, two modifications may be made. First, the lines may be reconfigured so that each memory cell can be individually programmed, erased and read without adversely affecting the memory state of other memory cells in the array, as further explained below. Second, continuous (analog) programming of the memory cells may be provided. Specifically, the memory or program state (i.e. charge on the floating gate as reflected by the number of electrons on the floating gate) of each memory cells in the array can be continuously changed from a fully erased state to a fully programmed state, and vice versa, independently and with minimal disturbance of other memory cells. This means the cell storage is analog or at the very least can store one of many discrete values, which allows for very precise and individual tuning of all the cells in the memory array, and which makes the memory array ideal for storing and making fine tuning adjustments to the synapsis weights of the neural network.

Memory Cell Programming and Storage

The neural network weight level assignments as stored in the memory cells can be evenly spaced as shown in FIG. 8A, or unevenly spaced as shown in FIG. 8B. Programming of the non-volatile memory cells can be implemented using a bidirectional tuning algorithm such as that shown in FIG. 9. Icell is the read current of the target cell being programmed, and Itarget is the desired read current when the cell is ideally programmed. The target cell read current Icell is read (step 1) and compared to the target read current Itarget (step 2). If the target cell read current Icell is greater than the target read current Itarget, a programming tuning process is performed (step 3) to increase the number of electrons on the floating gate 20 (in which a look up table or a silicon based approximate function may be used to determine the desired initial and increment programming voltage VCG on the control gate 22) (steps 3a-3b), which can be repeated as necessary (step 3c). If the target cell read current Icell is less than the target read current Itarget, an erase tuning process is performed (step 4) to decrease the number of electrons on the floating gate 20 (in which a look up table or a silicon based approximate function may be used to determine the desired initial and increment erase voltage VEG on the erase gate 30) (steps 4a-4b), which can be repeated as necessary (step 4c). If a programming tuning process overshoots the target read current, then an erase tuning process is performed (step 3d and starting with step 4a), and vice versa (step 4d and starting with step 3a), until the target read current is achieved (within an acceptable delta value).

Figure 9:
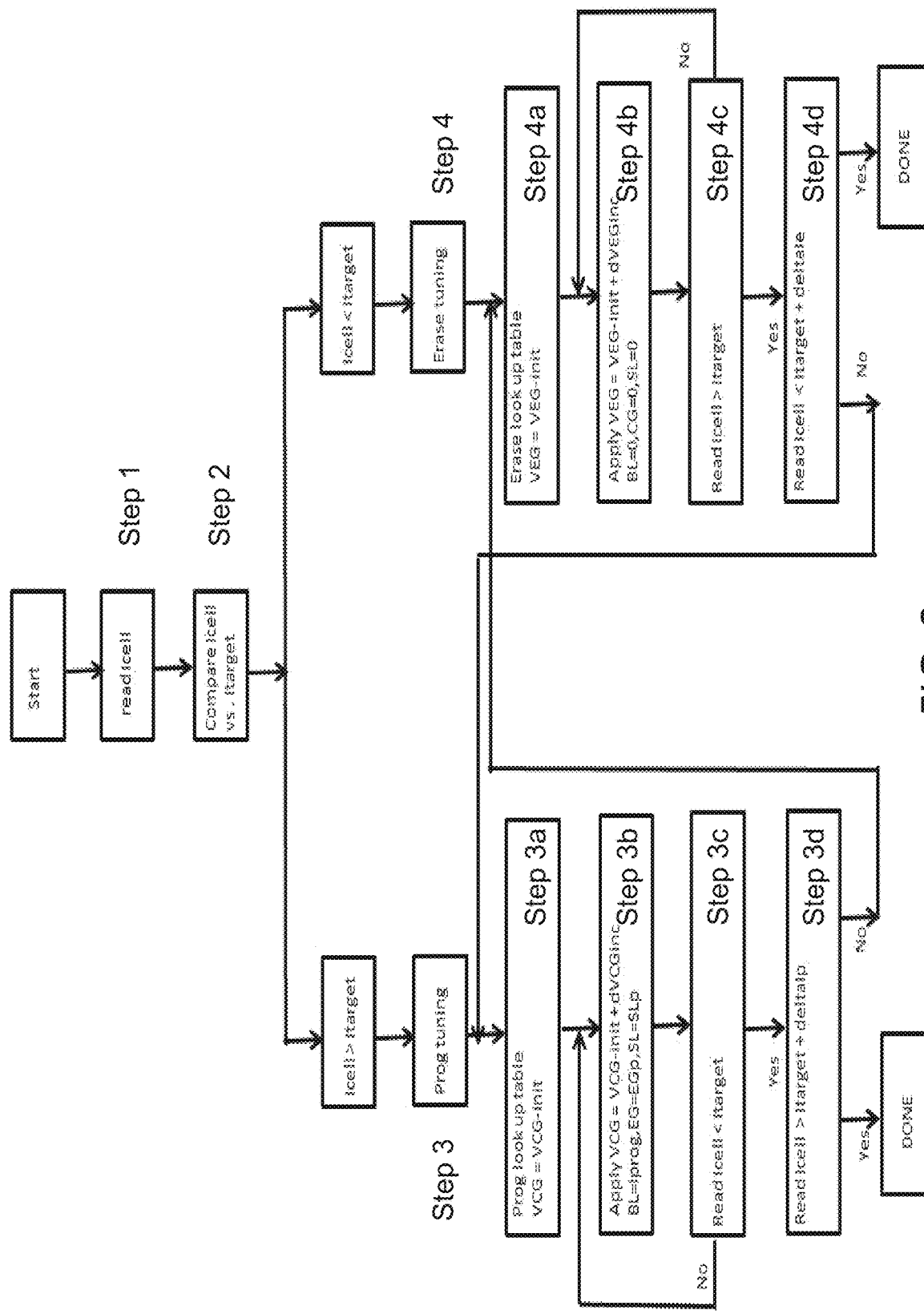
FIG. 9 is a flow diagram illustrating a bidirectional tuning algorithm.

Programming of the non-volatile memory cells can instead be implemented using a unidirectional tuning algorithm using programming tuning. With this algorithm, the memory cell 10 is initially fully erased, and then the programming tuning steps 3a-3c in FIG. 9 are performed until the read current of the target memory cell 10 reaches the target threshold value. Alternately, the tuning of the non-volatile memory cells can be implemented using the unidirectional tuning algorithm using erasing tuning. In this approach, the memory cell is initially fully programmed, and then the erasing tuning steps 4a-4c in FIG. 9 are performed until the read current of the target memory cell reaches the target threshold value.

Figure 10:
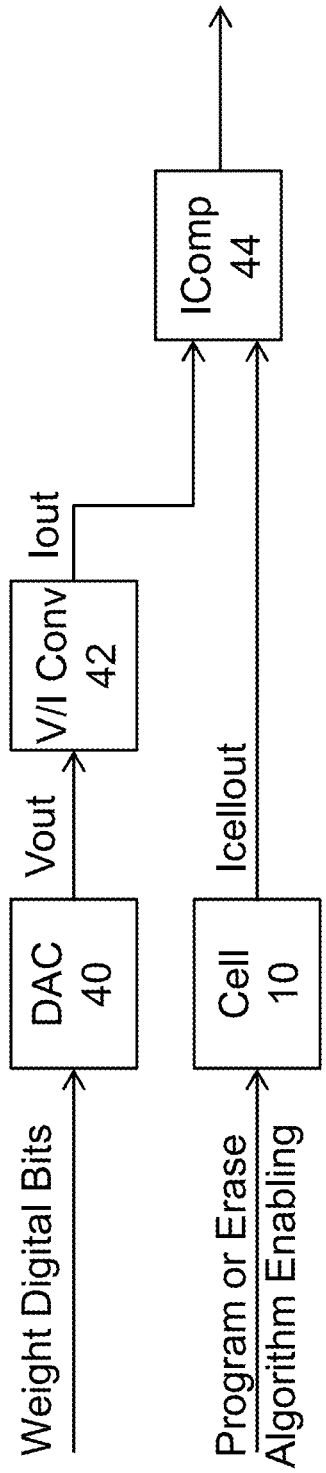
FIG. 10 is a block diagram illustrating weight mapping using current comparison.

FIG. 10 is a diagram illustrating weight mapping using current comparison. The weight digital bits (e.g., 5-bit weight for each synapse, representing the target digital weight for the memory cell) are input to a digital-to-analog converter (DAC) 40, which converts the bits to voltage Vout (e.g., 64 voltage levels-5 bits). Vout is converted to a current Iout (e.g. 64 current levels-5 bits) by voltage-to-current converter V/I Cony 42. The current Iout is supplied to a current comparator IComp 44. Program or erase algorithm enabling are input to the memory cell 10 (for example, erase: incrementing EG voltage; or program: increment CG voltage). The output memory cell current Icellout (i.e. from a read operation) is supplied to the current comparator IComp 44. The current comparator IComp 44 compares the memory cell current Icellout with the current Iout derived from the weight digital bits to produce a signal indicative of the weight stored in the memory cell 10.

Figure 11:
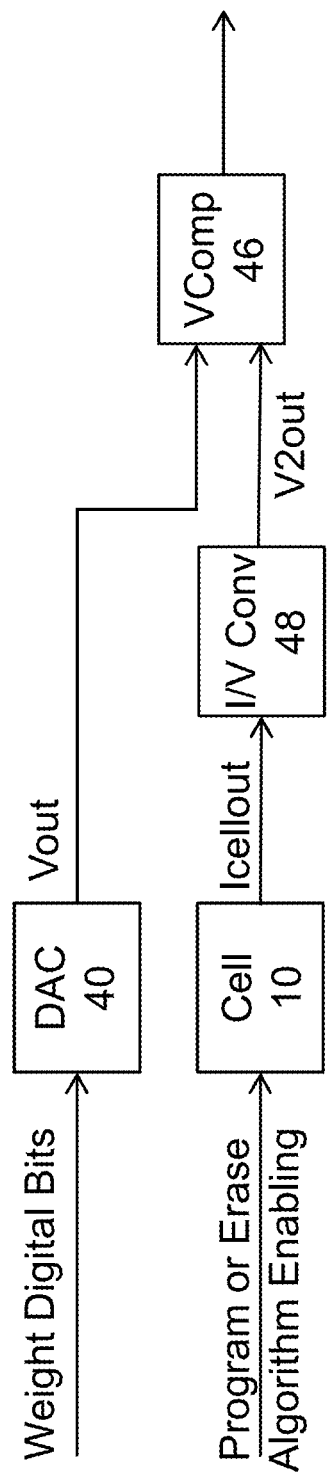
FIG. 11 is a block diagram illustrating weight mapping using voltage comparison.

FIG. 11 is a diagram illustrating weight mapping using voltage comparison. The weight digital bits (e.g., 5-bit weight for each synapse) are input to a digital-to-analog converter (DAC) 40, which converts the bits to voltage Vout (e.g., 64 voltage levels-5 bits). Vout is supplied to a voltage comparator VComp 46. Program or erase algorithm enabling are input to the memory cell 10 (for example, erase: incrementing EG voltage; or program: increment CG voltage). The output memory cell current Icellout is supplied to current-to-voltage converter I/V Cony 48 for conversion to a voltage V2out (e.g. 64 voltage levels-5 bits). Voltage V2out is supplied to voltage comparator VComp 46. The voltage comparator VComp 46 compares the voltages Vout and V2out to produce a signal indicative of the weight stored in the memory cell 10.

Another embodiment for weight mapping comparison uses variable pulse widths (i.e., pulse width is proportional or inversely proportional to the value of weight) for the input weight and/or the output of the memory cell. In yet another embodiment for weight mapping comparison, digital pulses (e.g., pulses generated from clocks, where the number of pulses are proportional or inversely proportional to the value of weight) are used for the input weight and/or the output of the memory cell.

Neural Networks Employing Non-Volatile Memory Cell Array

Figure 12:
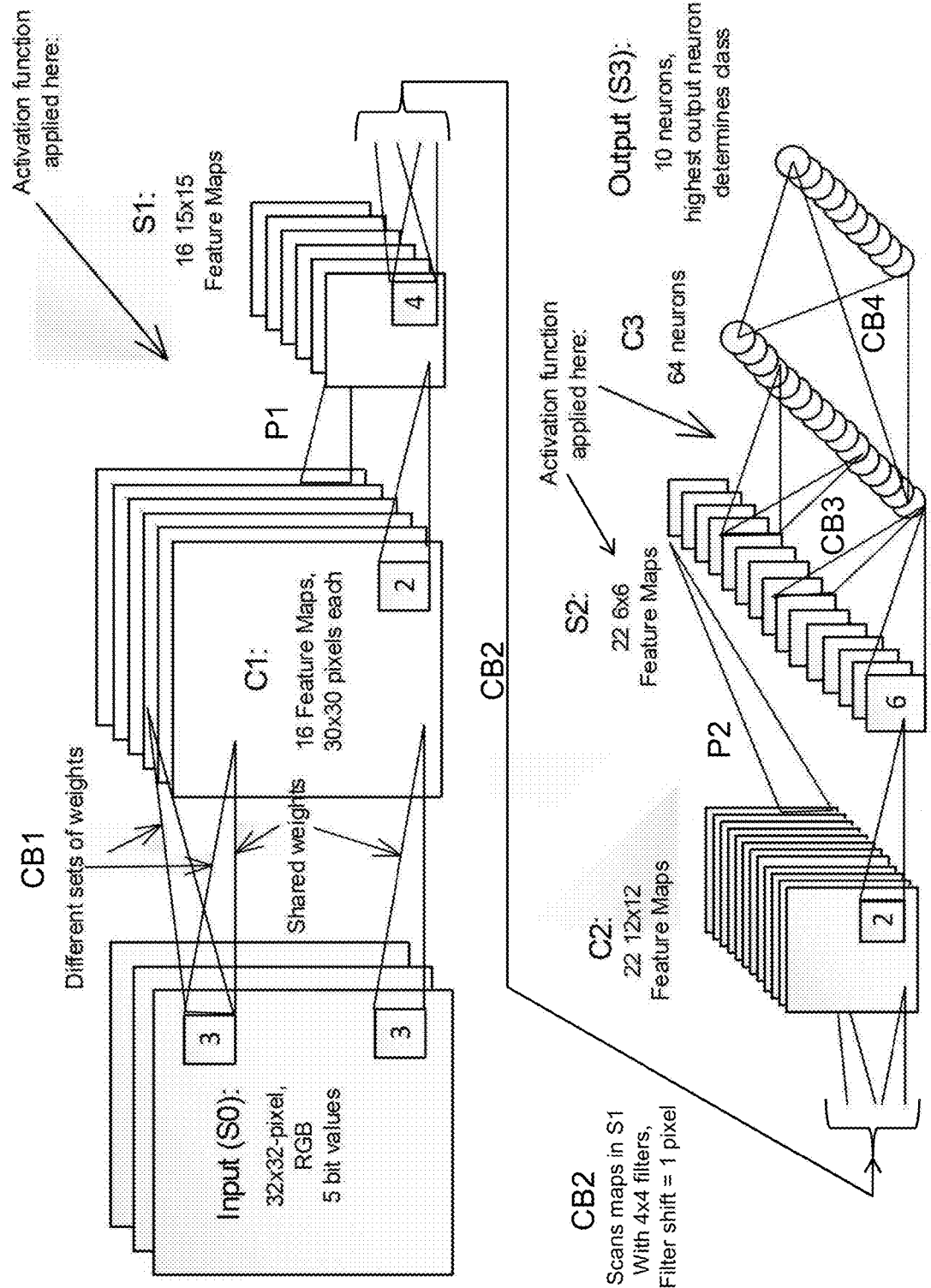
FIG. 12 is a diagram illustrating the different levels of an exemplary neural network utilizing a non-volatile memory array.

FIG. 12 conceptually illustrates a non-limiting example of a neural network utilizing a non-volatile memory array. This example uses the non-volatile memory array neural net for a facial recognition application, but any other appropriate application could be implemented using a non-volatile memory array based neural network. S0 is the input layer, which for this example is a 32×32 pixel RGB image with 5 bit precision (i.e. three 32×32 pixel arrays, one for each color R, G and B, each pixel being 5 bit precision). The synapses CB1 going from S0 to C1 have both different sets of weights and shared weights, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, whereby these 9 input values are multiplied by the appropriate weights and, after summing the outputs of that multiplication, a single output value is determined and provided by a first synapse of CB1 for generating a pixel of one of the layers of feature map C1. The 3×3 filter is then shifted one pixel to the right (i.e., adding the column of three pixels on the right, and dropping the column of three pixels on the left), whereby the 9 pixel values in this newly positioned filter are provided to the synapses CB1, whereby they are multiplied by the same weights and a second single output value is determined by the associated synapse. This process is continued until the 3×3 filter scans across the entire 32×32 pixel image, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example the synapses CB1 constitutes 16 layers of two dimensional arrays (keeping in mind that the neuron layers and arrays referenced herein are logical relationships, not necessarily physical relationships—i.e., the arrays are not necessarily oriented in physical two dimensional arrays). Each of the 16 feature maps is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling stage is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses and associated neurons in CB2 going from layer S1 to layer C2 scan maps in S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function is applied at the synapses CB3 going from layer S2 to layer C3, where every neuron in layer C3 connects to every map in layer S2. At layer C3, there are 64 neurons. The synapses CB4 going from layer C3 to the output layer S3 fully connects S3 to C3. The output at layer S3 includes 10 neurons, where the highest output neuron determines the class. This output could, for example, be indicative of an identification or classification of the contents of the original image.

Figure 13:
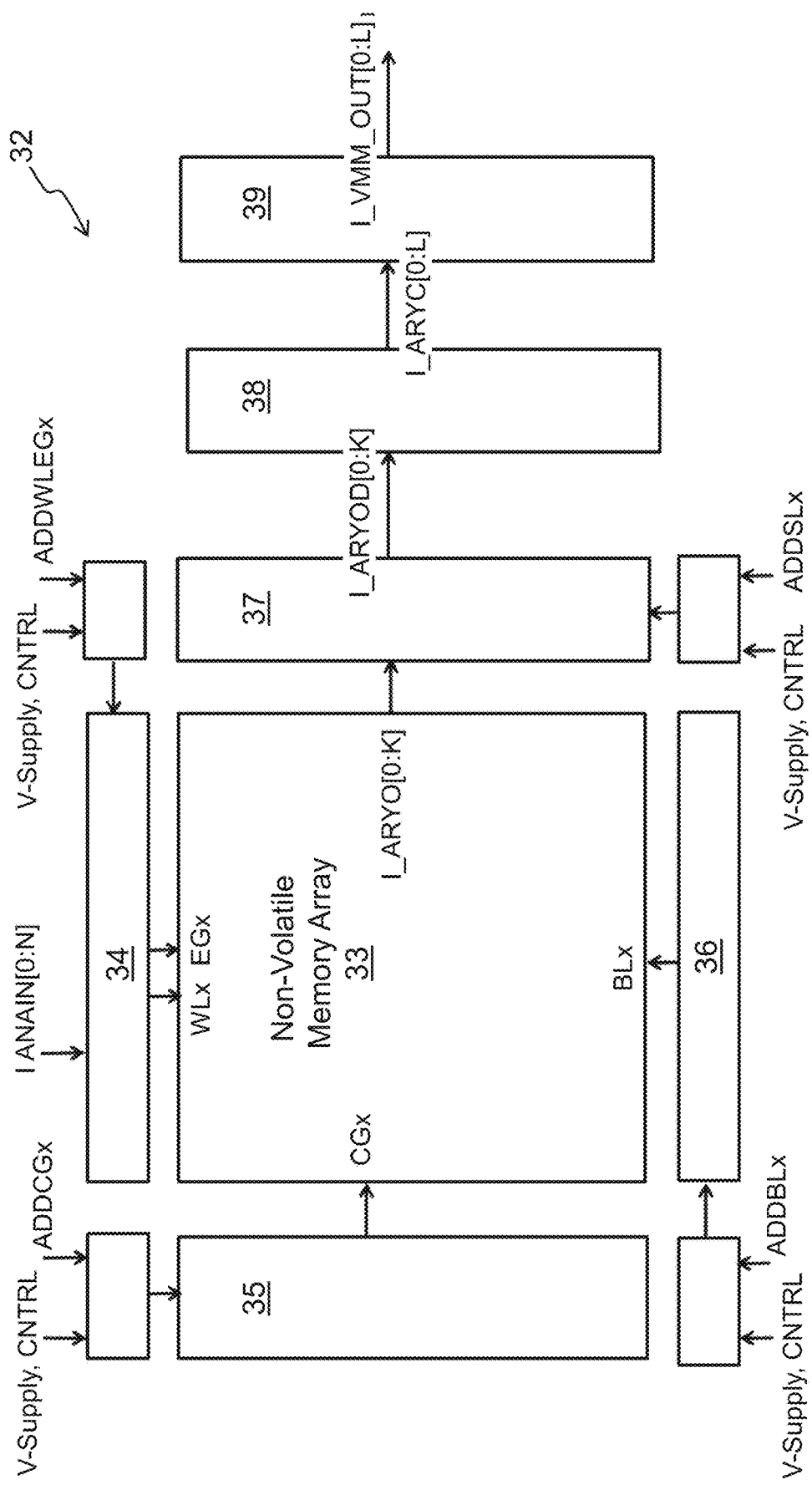
FIG. 13 is a block diagram illustrating a vector multiplier matrix.

Each level of synapses is implemented using an array, or a portion of an array, of non-volatile memory cells. FIG. 13 is a block diagram of the vector-by-matrix multiplication (VMM) array that includes the non-volatile memory cells, and is utilized as the synapses between an input layer and the next layer. Specifically, the VMM array 32 includes an array of non-volatile memory cells 33, erase gate and word line gate decoder 34, control gate decoder 35, bit line decoder 36 and source line decoder 37, which decode the inputs for the memory cell array 33. Source line decoder 37 in this example also decodes the output of the memory cell array 33. Alternatively, bit line decoder 36 can decode the output of the non-volatile memory cell array 33. The memory array serves two purposes. First, it stores the weights that will be used by the VMM array 32. Second, the memory cell array effectively multiplies the inputs by the weights stored in the memory cell array and adds together the results along each output line to produce the output, which will be the input to the next layer or input to the final layer. By performing the multiplication and addition function, the memory array negates the need for separate multiplication and addition logic circuits and is also power efficient due to its in-situ memory computation.

The output of the memory cell array is supplied to a single or differential summing circuit 38, which sums up the outputs of the memory cell array to create a single value for that convolution. The summed up output values are then supplied to the activation function circuit 39, which rectifies the output. The activation function can be sigmoid, tan h, or ReLu function. The rectified output values from circuit 39 become an element of a feature map as the next layer (C1 in the description above for example), and are then applied to the next synapse to produce next feature map layer or final layer. Therefore, in this example, the memory cell array 33 constitutes a plurality of synapses (which receive their inputs from the prior layer of neurons or from an input layer such as an image database), and summing circuit 38 and activation function circuit 39 constitute a plurality of neurons.

Figure 14:
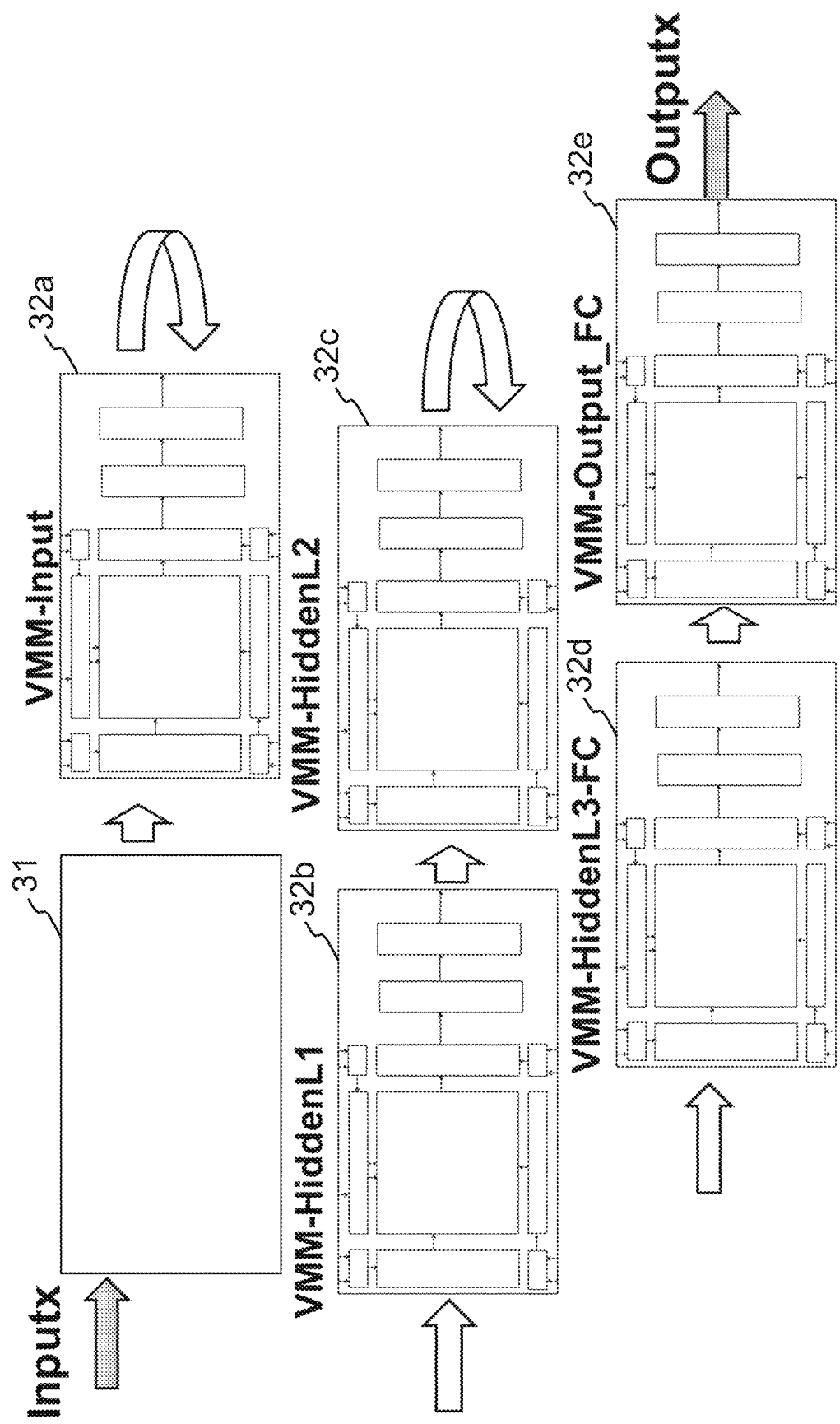
FIG. 14 is a block diagram illustrating various levels of a vector multiplier matrix.

FIG. 14 is a block diagram depicting the usage of numerous layers of VMM arrays 32, here labeled as VMM arrays 32a, 32b, 32c, 32d, and 32e. As shown in FIG. 14, the input, denoted Inputx, is converted from digital to analog by a digital-to-analog converter 31, and provided to input VMM array 32a. The output generated by the input VMM array 32a is provided as an input to the next VMM array (hidden level 1) 32b, which in turn generates an output that is provided as an input to the next VMM array (hidden level 2) 32c, and so on. The various layers of VMM array 32 function as different layers of synapses and neurons of a convolutional neural network (CNN). Each VMM array 32a, 32b, 32c, 32d, and 32e can be a stand-alone, physical non-volatile memory array, or multiple VMM arrays could utilize different portions of the same physical non-volatile memory array, or multiple VMM arrays could utilize overlapping portions of the same physical non-volatile memory array. The example shown in FIG. 14 contains five layers (32a, 32b, 32c, 32d, 32e): one input layer (32a), two hidden layers (32b, 32c), and two fully connected layers (32d, 32e). One of ordinary skill in the art will appreciate that this is merely exemplary and that a system instead could comprise more than two hidden layers and more than two fully connected layers.

Figure 15:
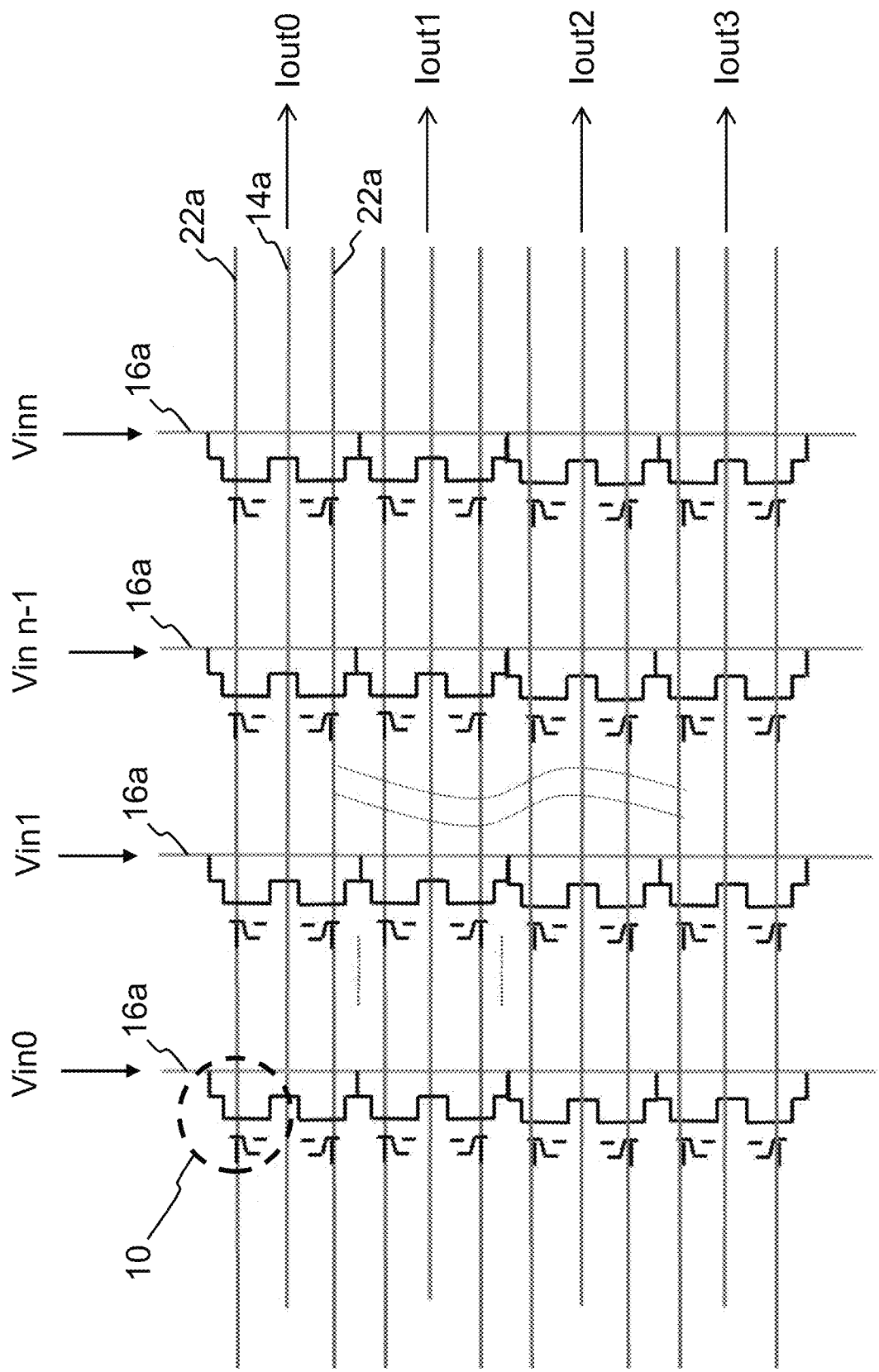
FIG. 15 is a schematic diagram illustrating a first architecture of an array of two-gate memory cells.

FIG. 15 illustrates an array of two-gate memory cells (i.e., such as that shown in FIG. 4) arranged as a source summing matrix multiplier. The various gate and region lines for the array of FIG. 15 are the same as that in FIG. 5 (with the same element numbers for corresponding structure). After each of the memory cells is programmed with the appropriate weight value for that cell, the array acts as a source summing matrix multiplier. The matrix voltage inputs are Vin0-Vinn and are placed on bit lines 16a. The matrix outputs Iout0 . . . IoutN for the array of FIG. 15 are produced on the source lines 22a. Each output Iout is a sum of the input current I times the weight W stored in the cell, for all the cells in the row:

$$I_{out} = \Sigma(I_j * W_{ij})$$

where "i" represents the row and "j" represents the column in which the memory cell resides. In the case where a input voltage is applied instead of input current, as indicated in FIG. 15 as Vin0-Vinn, then each output Iout is proportional to the sum of the input voltage times the weight W stored in the cell, for all the cells in the row:

$$I_{out} \propto \Sigma(V_j * W_{ij})$$

Each memory cell row acts as a single neuron having a summed weight value expressed as output current Iout dictated by the sum of the weight values stored in the memory cells in that row. The output of any given neuron is in the form of current, which can then be used as an input after adjustment by an activation function circuit for the next subsequent VMM array stage.

Figure 16:
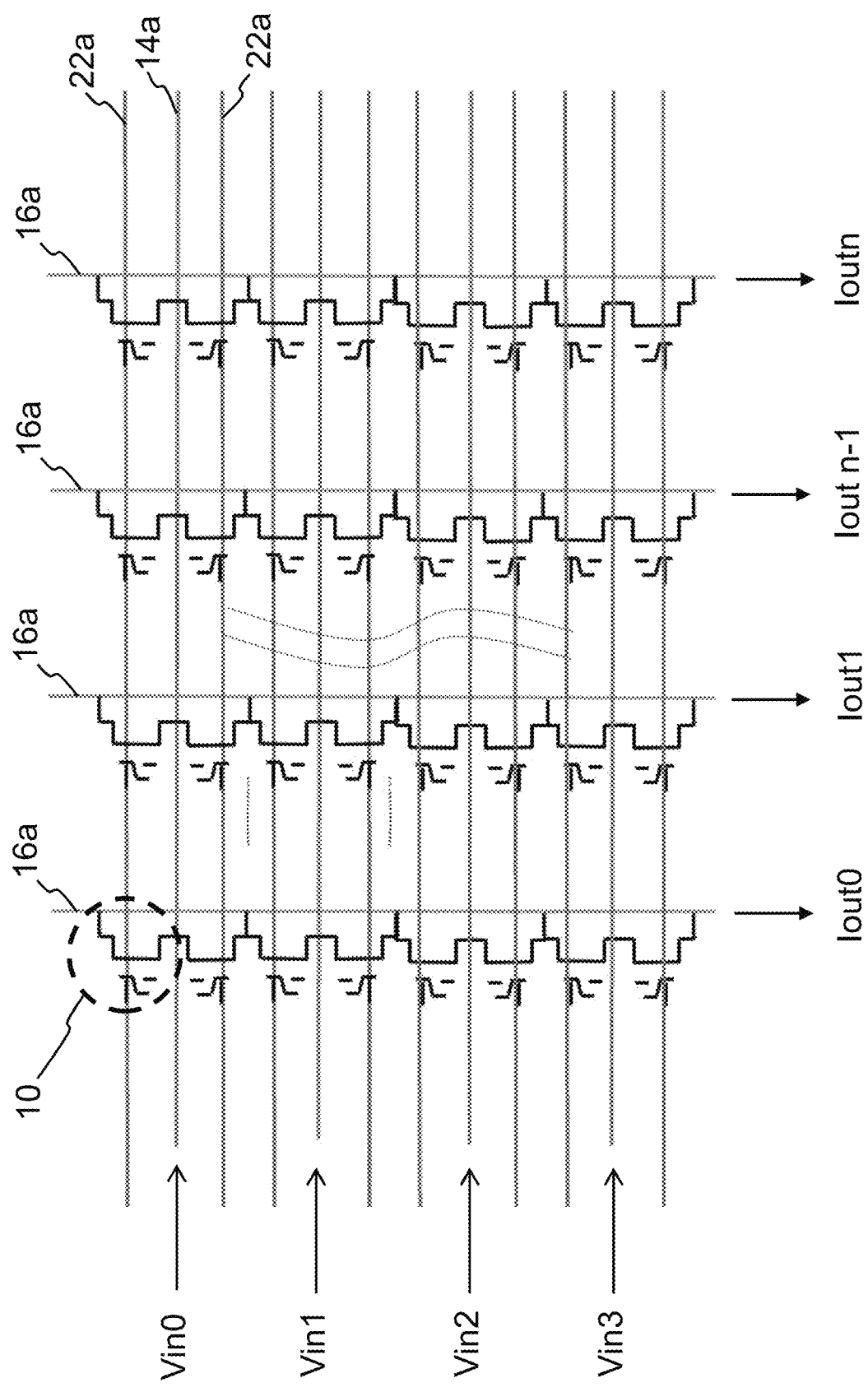
FIG. 16 is a schematic diagram illustrating a second architecture of an array of two-gate memory cells.

FIG. 16 illustrates another configuration of an array of two-gate memory cells 10 (i.e., such as that shown in FIG. 4) arranged as a drain (e.g., bit line of a memory array) summing matrix multiplier. The lines for the array of FIG. 16 are the same as that in the array of FIG. 15. However, the matrix voltage inputs Vin0 . . . Vin3 are placed on the source lines 14a, and the matrix outputs Iout0 . . . IoutN are produced on the bit lines 16a (i.e., each output Iout is a sum of the cell current which is proportional to the weight W stored in the cell, for all the cells in the column). As with the previous embodiment, the output of any given neuron is in the form of current, which can then be used as an input current after adjusted by an activation function circuit for the next subsequent VMM array stage.

Figure 17:
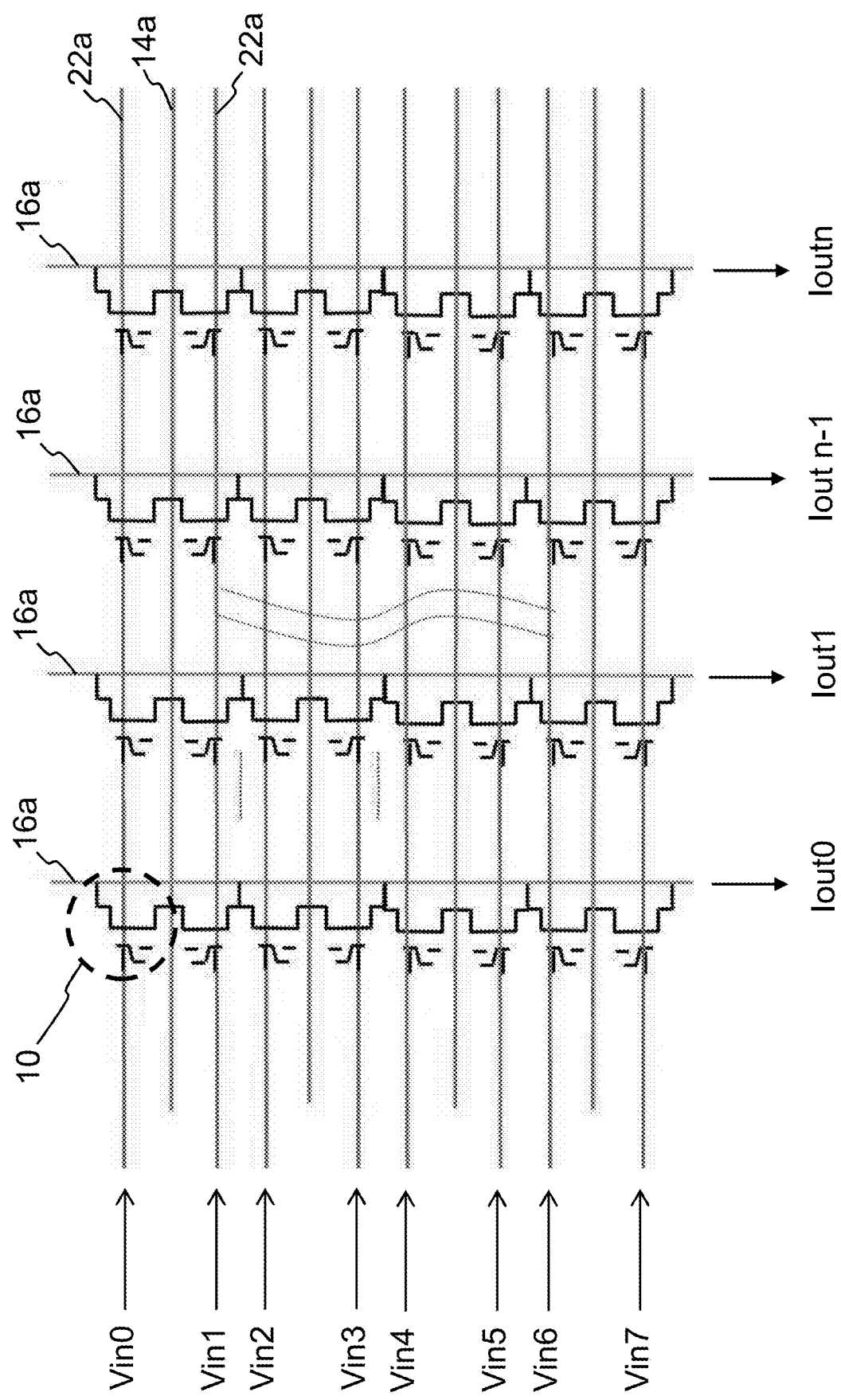
FIG. 17 is a schematic diagram illustrating a third architecture of an array of two-gate memory cells.

FIG. 17 illustrates another configuration of an array of two-gate memory cells (i.e., such as that shown in FIG. 4) arranged as a drain summing matrix multiplier. The lines for the array of FIG. 17 are the same as that in the array of FIG. 15. However, the matrix voltage inputs Vin0 . . . Vin7 are placed on the control gate lines 22a, and the matrix outputs (currents) Iout0 . . . IoutN are produced on the bit lines 16a (i.e., each output Iout is a sum of the cell current which is proportional to the weight W stored in the cell, for all the cells in the column).

Figure 18:
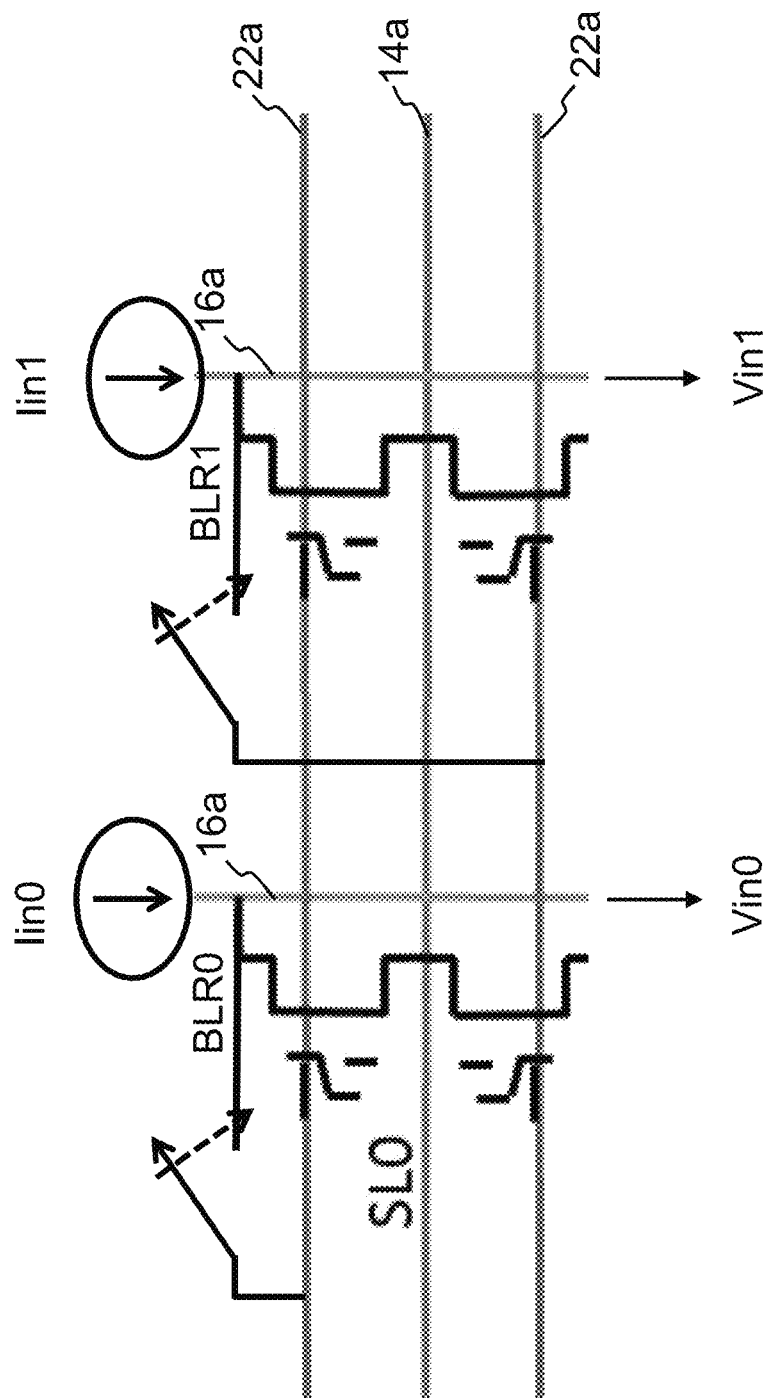
FIG. 18 is a schematic diagram illustrating a current-to-voltage converter using two-gate memory cells.

Given that the inputs are voltages, and the outputs are currents, in FIG. 17, each subsequent VMM stage after the first stage preferably includes circuitry for converting incoming currents from the previous VMM stage into voltages to be used as the input voltages Vin. FIG. 18 illustrates an example of such current-to-voltage conversion circuitry, which is a modified row of memory cells that log converts the incoming currents Iin0 . . . IinN into the input voltages Vin0 . . . VinN for application to the subsequent stage. The memory cells described herein are biased in weak inversion, $$Ids = Io * e^{(Vg-Vth)/kVt} = w * Io * e^{(Vg)/kVt}$$

where $w = e^{(-Vth)/kVt}$

For the I-to-V log converter using a memory cell to convert input current into an input voltage:

$$Vg = k * Vt * \log[Ids/wp * Io]$$

Here, wp is w of a reference or peripheral memory cell. For a memory array used as a vector matrix multiplier VMM, the output current is:

$$Iout = wa * Io * e^{(Vg)/vt}, \text{namely}$$

$$Iout = (wa/wp) * Iin = W * Iin$$

$$W = e^{(Vthp - Vtha)/kVt}$$

Here, wa=w of each memory cell in the memory array. A control gate line 22a can be used as the input for the memory cell for the input voltage, which is connected to the bit lines 16a by switches BLR that are closed during current to voltage conversion.

Alternatively, the non-volatile memory cells of VMM arrays described herein can be configured to operate in the linear region:

$$Ids = \text{beta} * (Vgs - Vth) * Vds; \text{beta} = u * Cox * Wt/L,$$

where Wt and L are the width and length respectively of the transistor

W α (Vgs−Vth), meaning weight W is proportional to (Vgs−Vth)

A control gate line or bit line or source line can be used as the input for the memory cell operated in the linear region. The bit line or source line can be used as the output for the output neuron.

For an I-to-V linear converter, a memory cell (such as a reference memory cell or a peripheral memory cell) or a transistor operating in the linear region or a resistor can be used to linearly convert an input/output current into an input/output voltage. Alternatively, the non-volatile memory cells of VMM arrays described herein can be configured to operate in the saturation region:

$$Ids = \frac{1}{2} * \text{beta} * (Vgs - Vth)^2; \text{beta} = u * Cox * Wt/L$$

W α (Vgs−Vth)$^2$, meaning weight W is proportional to (Vgs−Vth)$^2$

A control gate line can be used as the input for the memory cell operated in the saturation region. The bit line or source line can be used as the output for the output neuron. Alternatively, the non-volatile memory cells of VMM arrays described herein can be used in all regions or a combination thereof (sub threshold, linear, or saturation). Any of the above described current to voltage conversion circuits or techniques can be used with any of the embodiments herein so that the current output from any given neuron in the form of current can then be used as an input after adjusted by an activation function circuit for the next subsequent VMM array stage.

Figure 19:
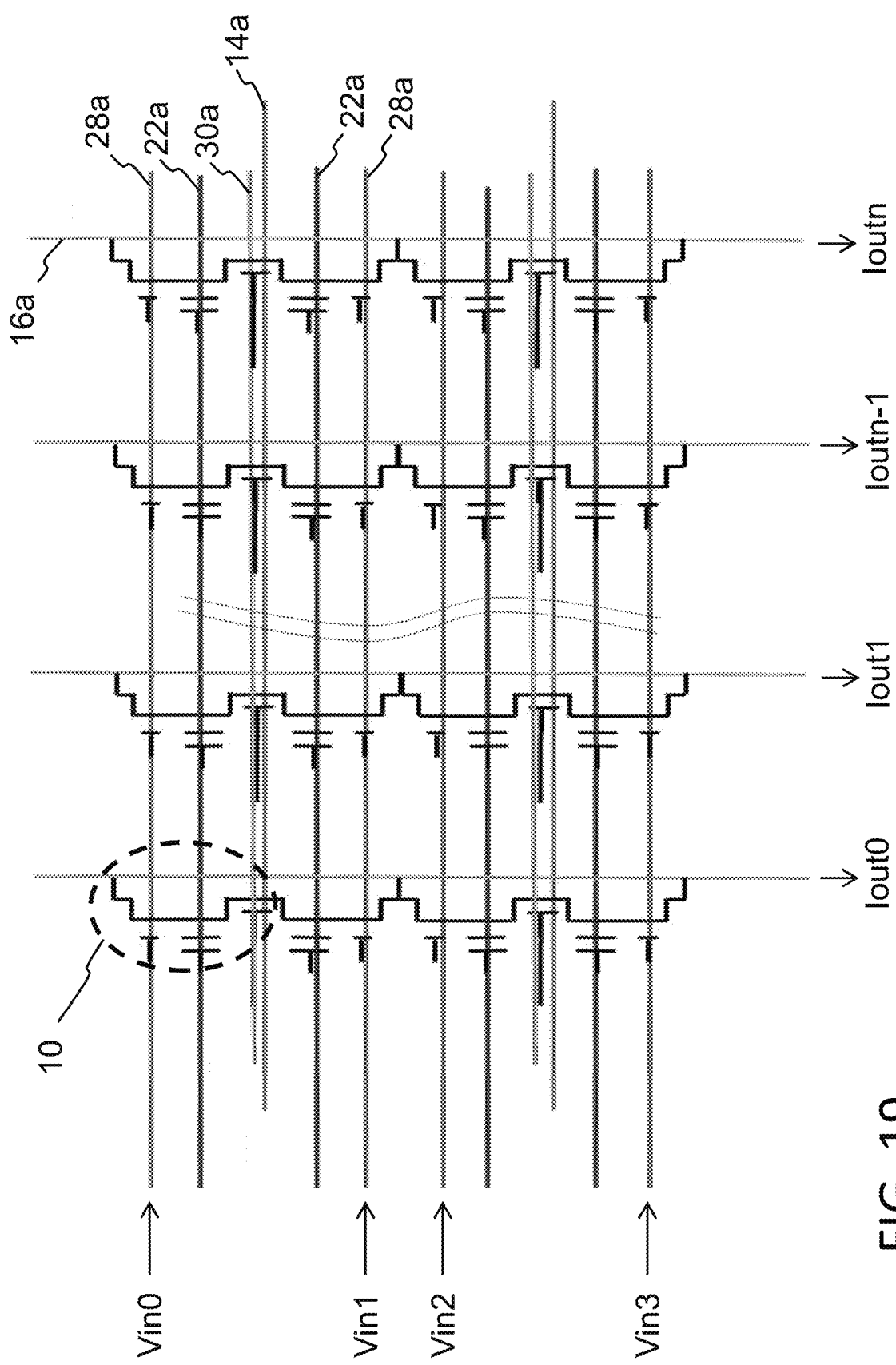
FIG. 19 is a schematic diagram illustrating a first architecture of an array of four-gate memory cells.

FIG. 19 illustrates a configuration of an array of four-gate memory cells (i.e., such as that shown in FIG. 6) arranged as a drain (bit line) summing matrix multiplier. The lines for the array of FIG. 19 are the same as that in the array of FIG. 7. After each of the memory cells is programmed with the appropriate weight value for that cell, the array acts as a drain summing matrix multiplier. The matrix voltage inputs are Vin0-Vin3 and are placed on select gate lines 28a. The matrix outputs Iout0 . . . Ioutn are produced on the bit lines 16a. Each output Iout is a sum of the cell current that is proportional to the weight W stored in the cell, for all the cells in the column.

Figure 20:
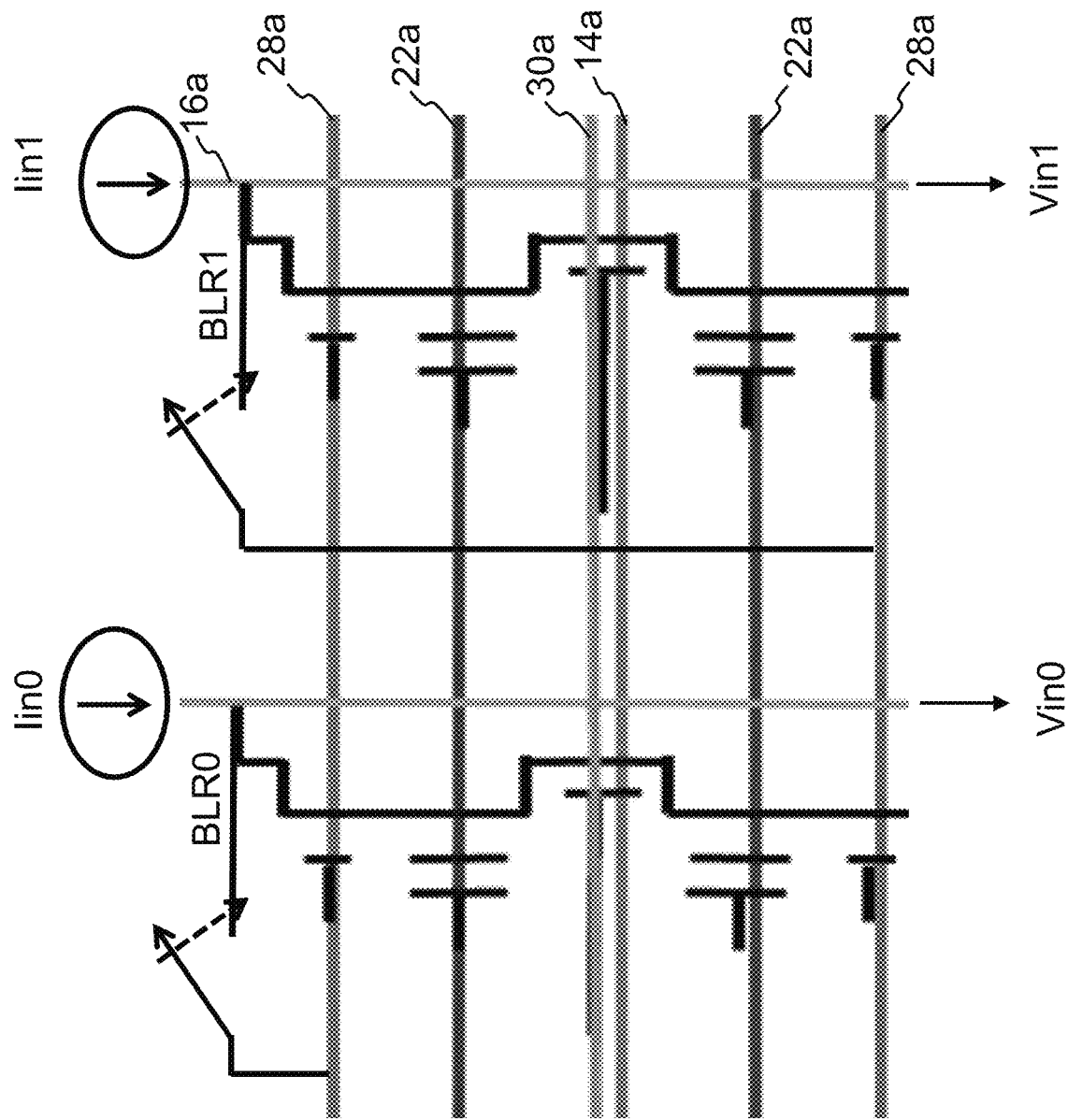
FIG. 20 is a schematic diagram illustrating a current-to-voltage converter using four-gate memory cells.

Given that the inputs are voltages, and the outputs are current, in FIG. 19, each subsequent VMM stage after the first stage preferably includes circuitry for converting incoming currents from the previous VMM stage into voltages to be used as the input voltages Vin. FIG. 20 illustrates an example of such current-to-voltage conversion circuitry, which is a modified row of memory cells that log converts the incoming currents Iin0 . . . IinN into the input voltages Vin0 . . . VinN. Similarly, a linear current-to-voltage converter can be used with the modified memory cell operated in linear region to convert linearly the incoming currents Iin0 . . . IinN into the input voltages Vin0 . . . VinN. As shown in FIG. 20, the select gate line 28a is connected to the bit line 16a by switches BLR for current to voltage conversion. Alternately, the control gate line 22a could be connected to the bit line 16a for current to voltage conversion.

Figure 21:
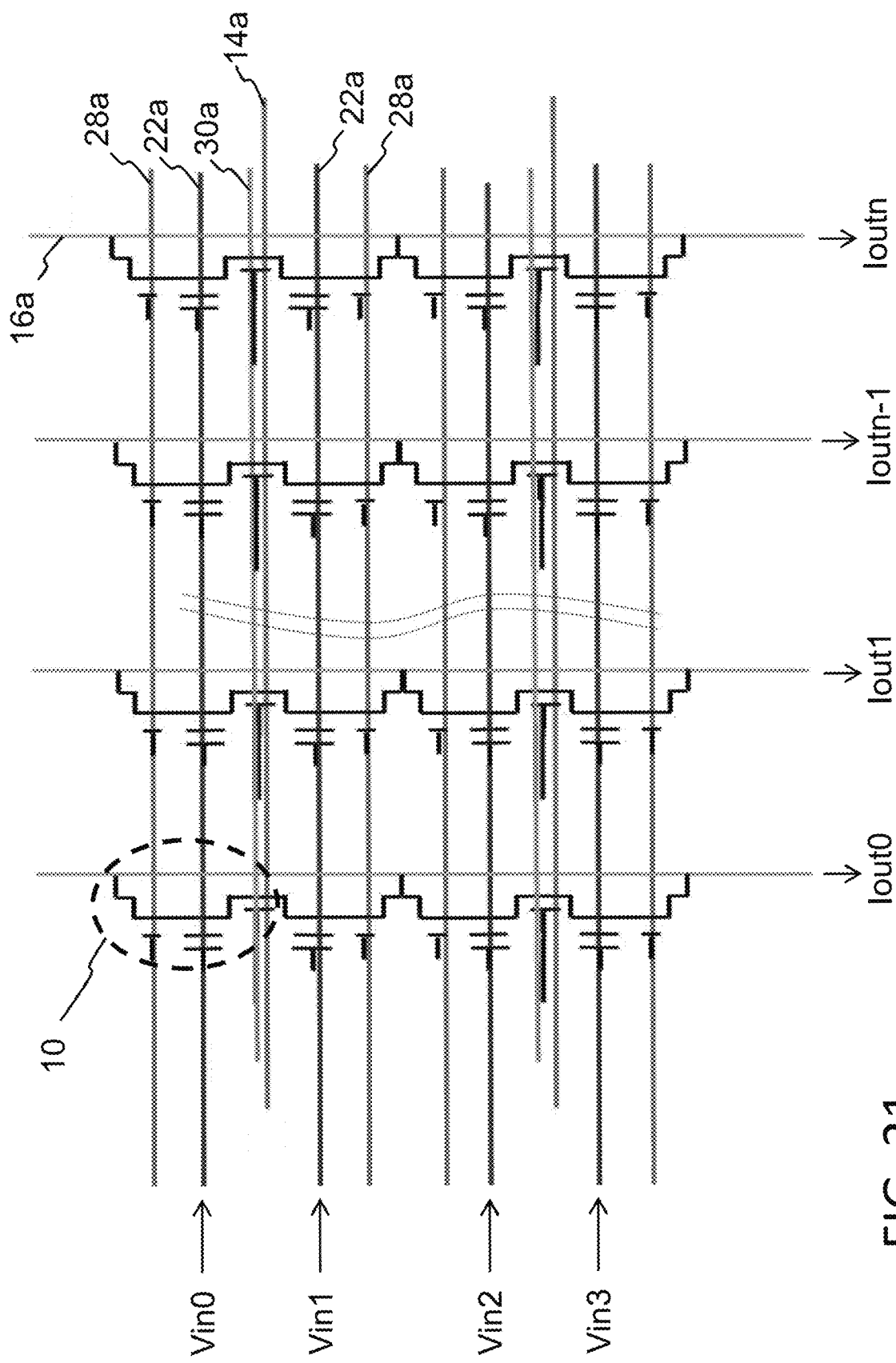
FIG. 21 is a schematic diagram illustrating a second architecture of an array of four-gate memory cells.

FIG. 21 illustrates another configuration of an array of four-gate memory cells (i.e., such as that shown in FIG. 6) arranged as a drain summing matrix multiplier. The lines for the array of FIG. 21 are the same as that in the array of FIG. 7. After each of the memory cells is programmed with the appropriate weight value for that cell, the array acts as a drain summing matrix multiplier. The matrix voltage inputs are Vin0-Vin3 and are placed on control gate lines 22a. The matrix outputs Iout0 . . . Ioutn are produced on the bit lines 16a. Each output Iout is a sum of the cell current that is proportional to the weight W stored in the cell, for all the cells in the column.

Figure 22:
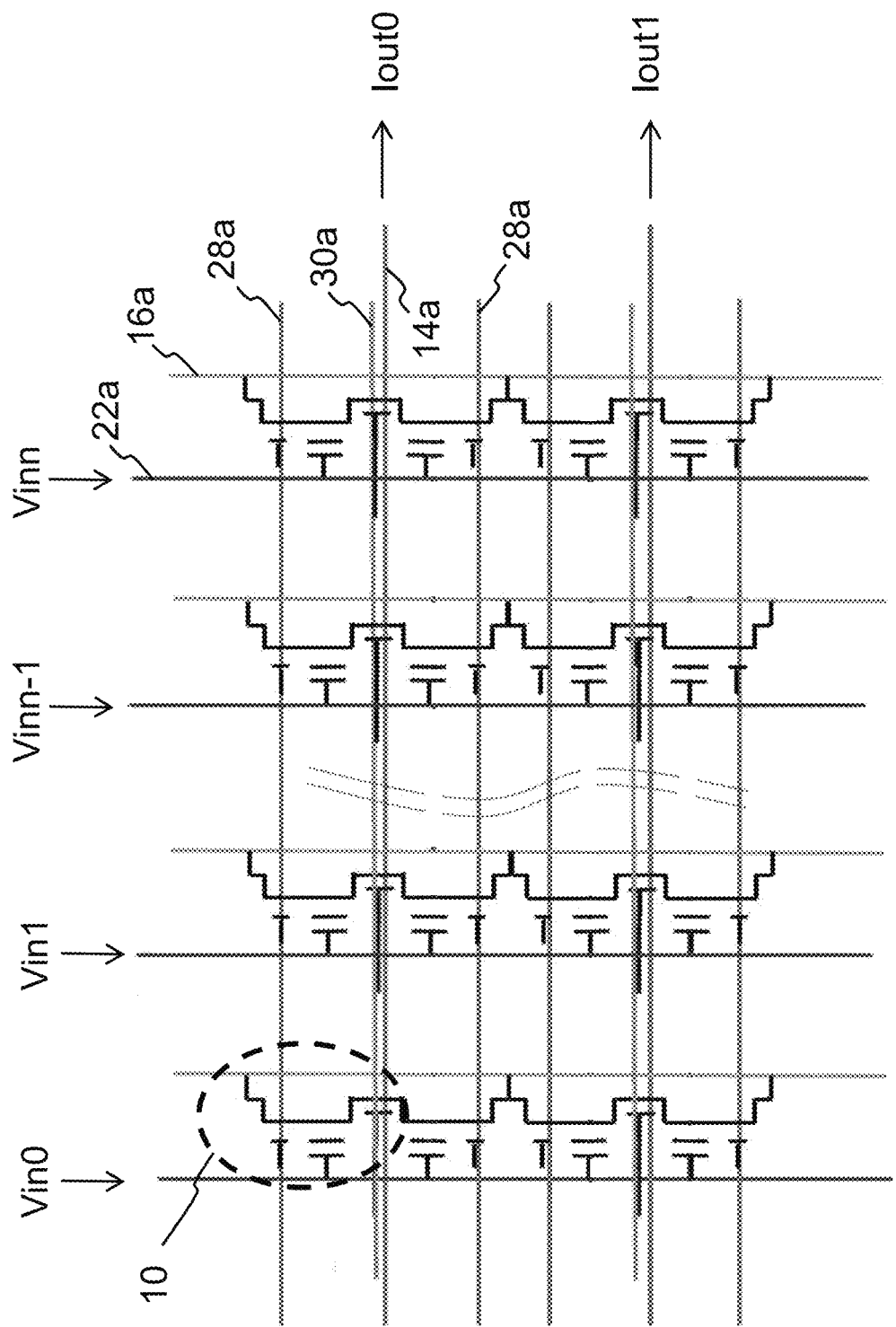
FIG. 22 is a schematic diagram illustrating a third architecture of an array of four-gate memory cells.

FIG. 22 illustrates another configuration of an array of four-gate memory cells 10 (i.e., such as that shown in FIG. 6) arranged as a source summing matrix multiplier. The lines for the array of FIG. 22 are the same as the array of FIG. 7, except that the control gate lines 22a run vertically instead of horizontally, so that each memory cell can be independently programmed, erased and read. Specifically, each column of memory cells includes a control gate line 22a connecting together all the control gates 22 of the memory cells in that column. The matrix voltage inputs Vin0 . . . VinN are provided on the control gate lines 22a, and the matrix outputs Iout0 . . . Iout1 are produced on the source lines 14a.

Figure 23:
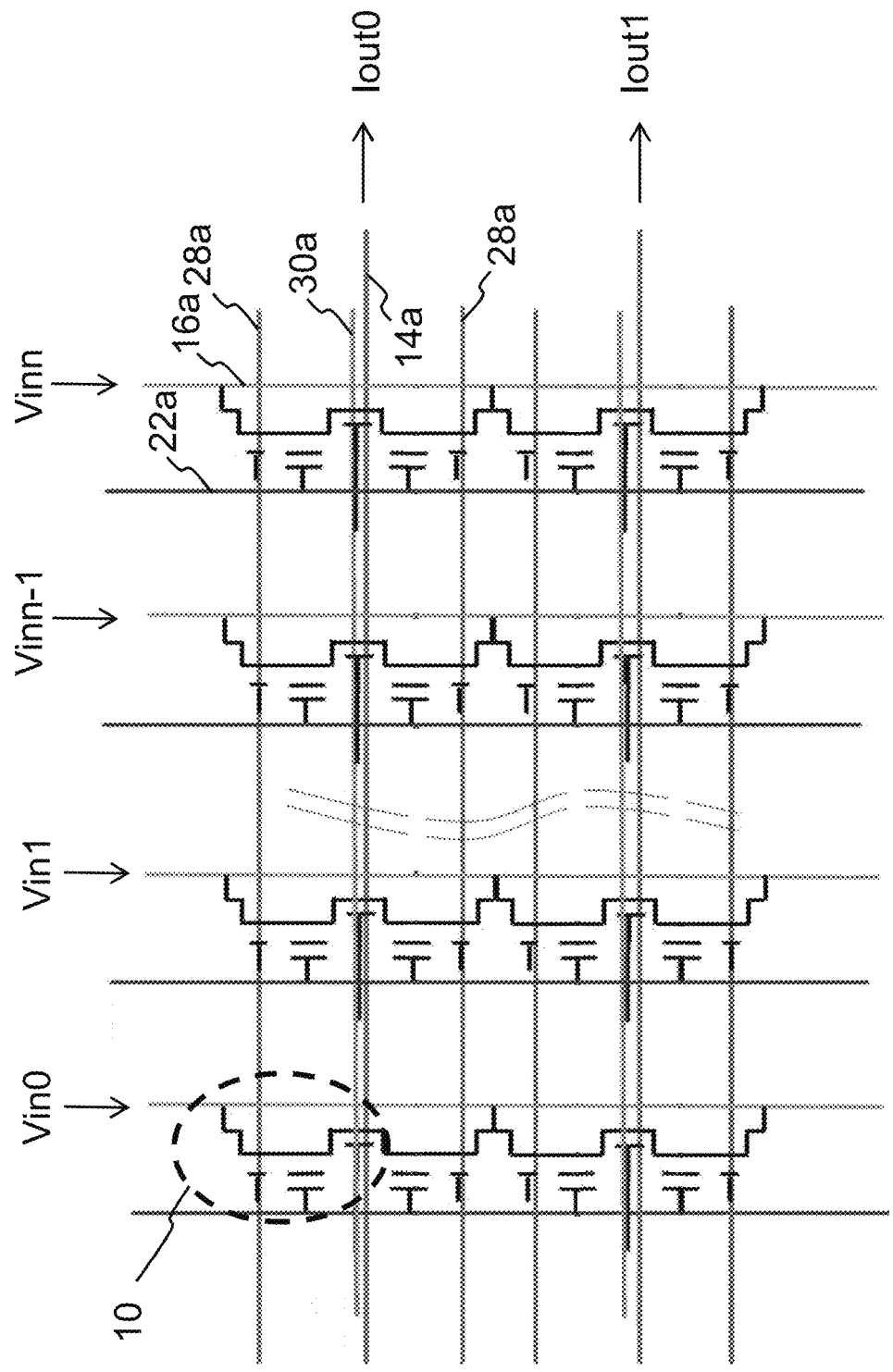
FIG. 23 is a schematic diagram illustrating a fourth architecture of an array of four-gate memory cells.

FIG. 23 illustrates another configuration of an array of four-gate memory cells (i.e., such as that shown in FIG. 6) arranged as a source summing matrix multiplier. The lines for the array of FIG. 23 are the same as the array of FIG. 22. The matrix voltage inputs Vin0 . . . VinN are provided on the bit lines 16a, and the matrix outputs Iout0 . . . Iout1 are produced on the source lines 14a.

Figure 24:
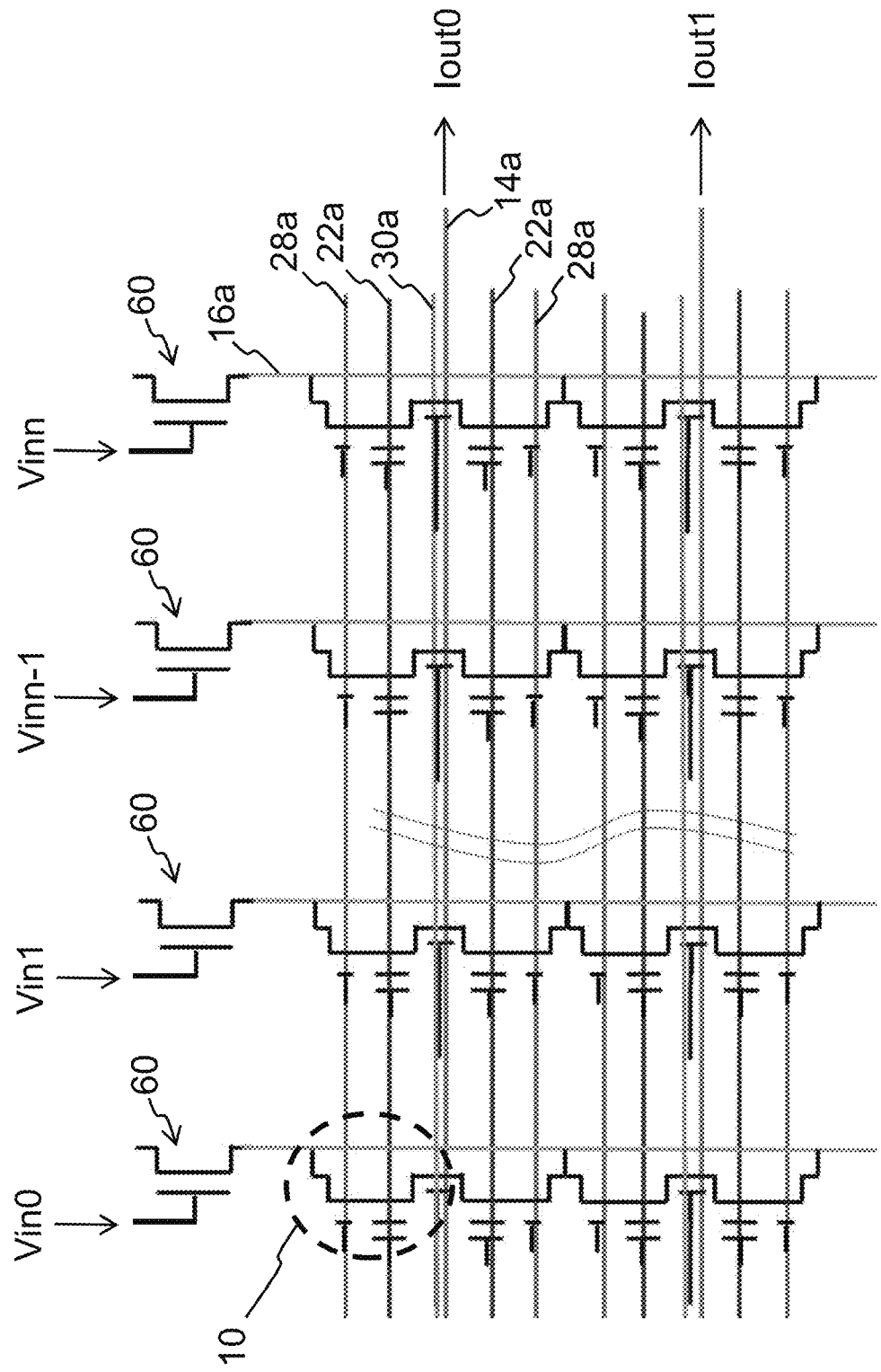
FIG. 24 is a schematic diagram illustrating a fifth architecture of an array of four-gate memory cells.

FIG. 24 illustrates another configuration of an array of four-gate memory cells (i.e., such as that shown in FIG. 6) arranged as a source summing matrix multiplier. The lines for the array of FIG. 24 are the same as the array of FIG. 22, except that each bit line includes a bit line buffer transistor 60 that acts as a switch that turns on the bit line (i.e., couples the bit line to its current or voltage source). The matrix inputs Vin0 . . . VinN are provided to the gates of the transistors 60, and the matrix outputs Iout0 . . . Iout1 are provided on the source lines 14a. The advantage of this configuration is that the matrix inputs can be supplied as voltages (which operate transistors 60), instead of supplying inputs directly to the bit lines. This allows for a constant voltage source be applied to the bit lines (i.e., through transistors 60), which are provided in response to the input voltage Vin supplied to the transistors' gates.

Figure 26:
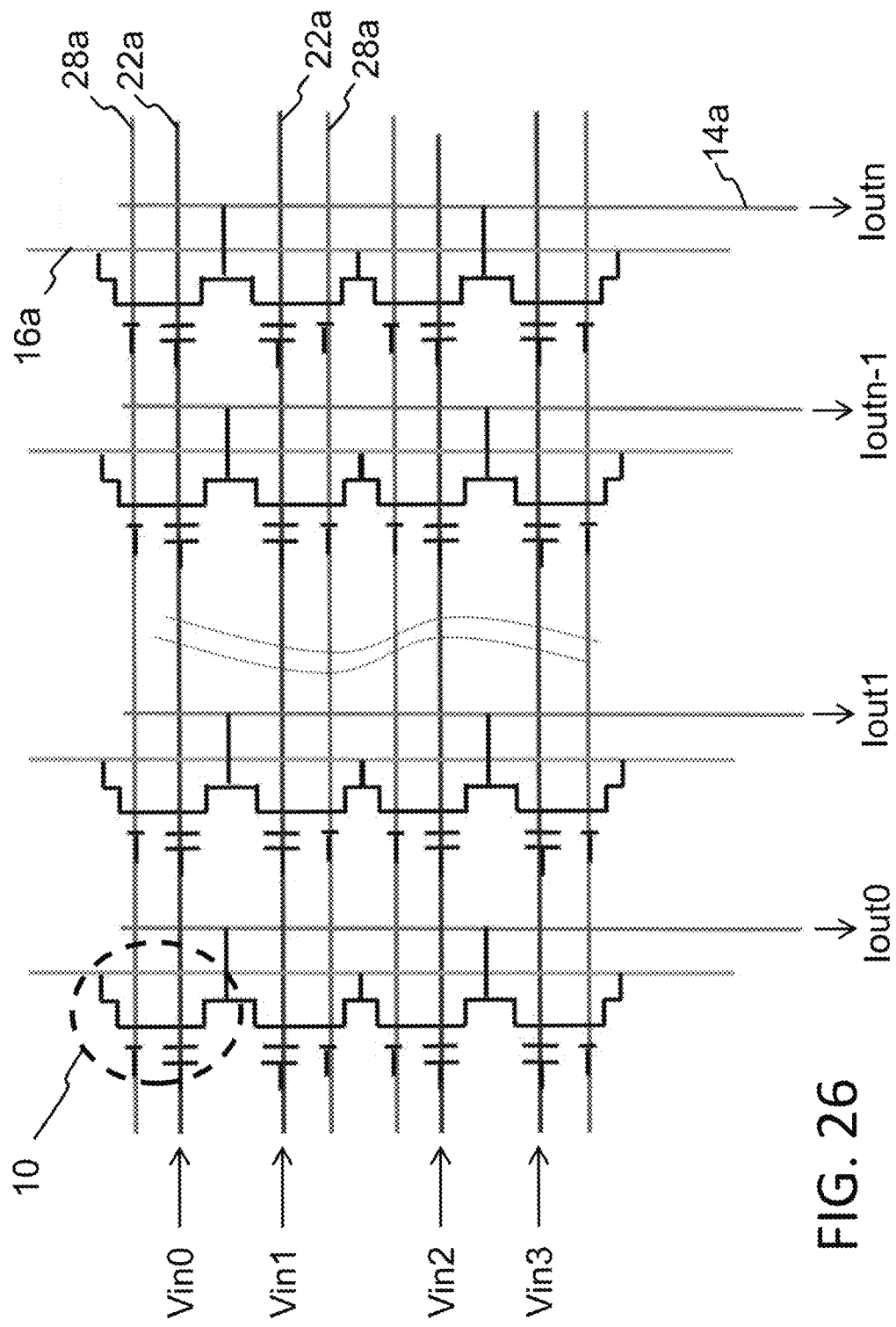
FIG. 26 is a schematic diagram illustrating an architecture of an array of three-gate memory cells.

FIGS. 25-26 illustrate a configuration of an array of three-gate memory cells arranged as a drain summing matrix multiplier. The memory cell is shown in FIG. 25, and is the same as that of FIG. 6, except there is no erase gate. In one embodiment, cell erasing is performed by applying a positive voltage to the select gate 28, where electrons tunnel from the floating gate 20 to the select gate 28. Below is a table of exemplary and non-limiting operational voltages for the three-gate memory cell of FIG. 25.

TABLE 3

|  | SG 28a | BL 16a | CG 22a | SL 14a |
| --- | --- | --- | --- | --- |
| Read 1 | 0.5.0-2 V | 0.1-2 V | 0-2.6 V | 0.1-2 V |
| Read 2 | 0.5-2 V | 0-2 V | 0-2.6 V | 2-0.1 V |
| Erase | 3-12 V | 0 V | 0 V to −13 V | 0 V |
| Program | 1 V | 1 uA | 8-11 V | 4.5-8 V |

Read 1 is a read mode in which the cell current comes out on the bit line. Read 2 is a read mode in which the cell current comes out on the source line.

The lines for the array of the memory cells are shown in FIG. 26, and are the same as that in the array of FIG. 19, except that there is no erase gate line 30a (because there are no erase gates), and the source lines 14a run vertically instead of horizontally, so that each memory cell can be independently programmed, erased and read. Specifically, each column of memory cells includes a source line 14a connecting together all the source regions 14 for the memory cells in that column. After each of the memory cells is programmed with the appropriate weight value for that cell, the array acts as a source summing matrix multiplier. The matrix voltage inputs are Vin0-Vin3 and are placed on the control gate lines 22a. Alternatively the matrix voltage inputs can be placed on the select gate lines 28a. The matrix outputs Iout0 . . . Ioutn are produced on the source lines 14a. Each output Iout is a sum of the cell current that is proportional to the weight W stored in the cell, for all the cells in the column. Alternatively the matrix outputs are produced on the bit lines 16a. In another embodiment, the source lines 14a run horizontally (i.e. each connecting all the source regions for the row of memory cells). An alternative erase operation for FIGS. 25-26 can have the p-type substrate 12 at a high voltage, e.g., 10V to 20V, and the control gate 22 at a low or negative voltage, e.g. −10V to 0V, whereby electrons will tunnel from the floating gate 20 to the substrate 12.

FIG. 27 shows a memory cell 10 with 3 gates that is similar to the memory cell in FIG. 6, except there is no control gate 22. Read, erase, and program is done in a similar manner, but without any bias to a control gate. Exemplary, non-limiting operating voltages can include those in Table 4 below:

TABLE 4

|  | SG 28a | BL 16a | EG 30a | SL 14a |
| --- | --- | --- | --- | --- |
| Read 1 | 0.5-2 V | 0.1-2 V | 0-2.6 V | 0 V |
| Read 2 | 0.5-2 V | 0-2 V | 0-2.6 V | 2-0.1 V |
| Erase | −0.5 V/0 V | 0 V | 8-12 V | 0 V |
| Program | 1 V | 1 uA | 4.5-7 V | 4.5-7 V |

Read 1 is a read mode in which the cell current comes out on the bit line. Read 2 is a read mode in which the cell current comes out on the source line.

Figure 28:
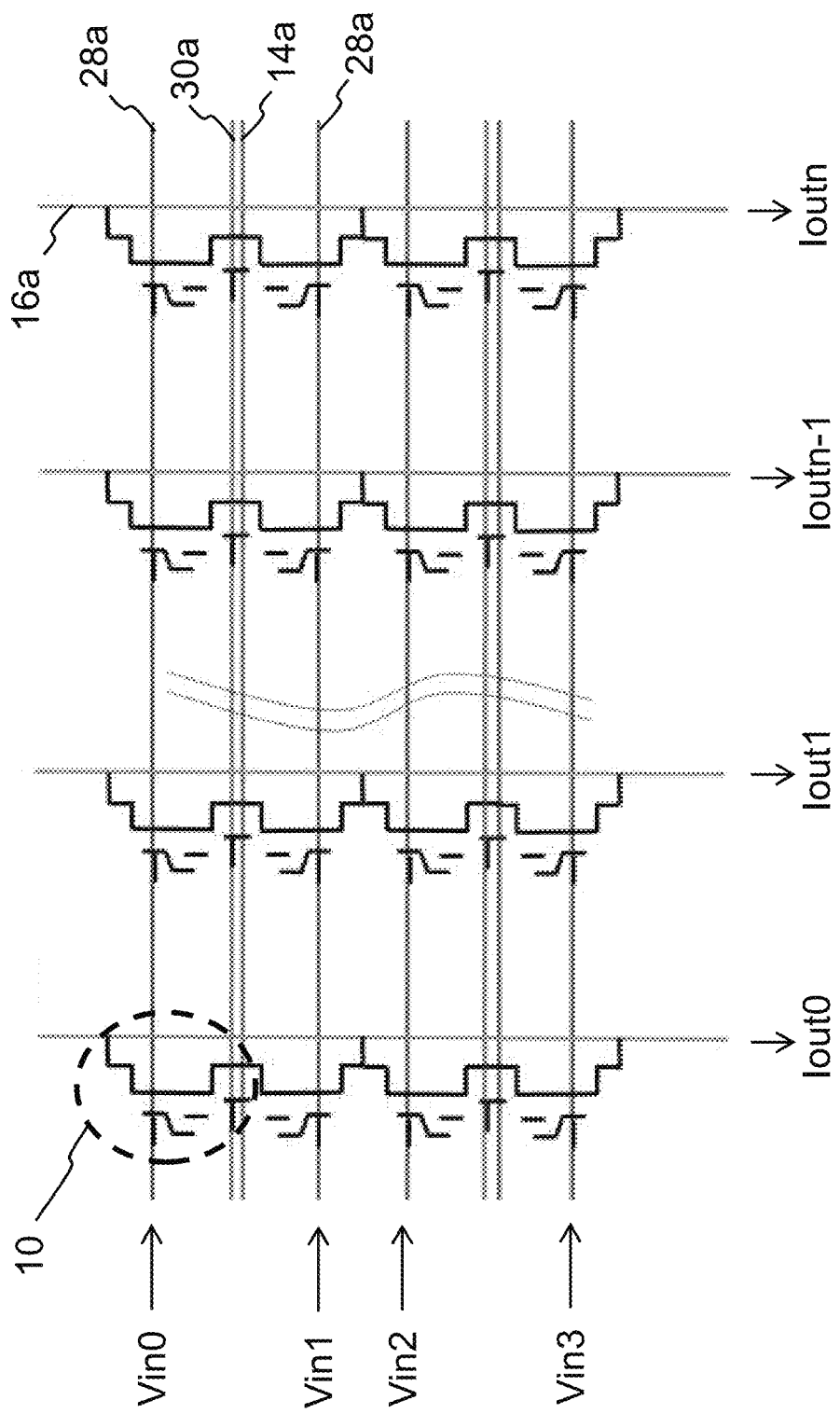
FIGS. 28-31 are schematic diagrams illustrating architectures of arrays of the three-gate memory cell of FIG. 27.
Figure 29:
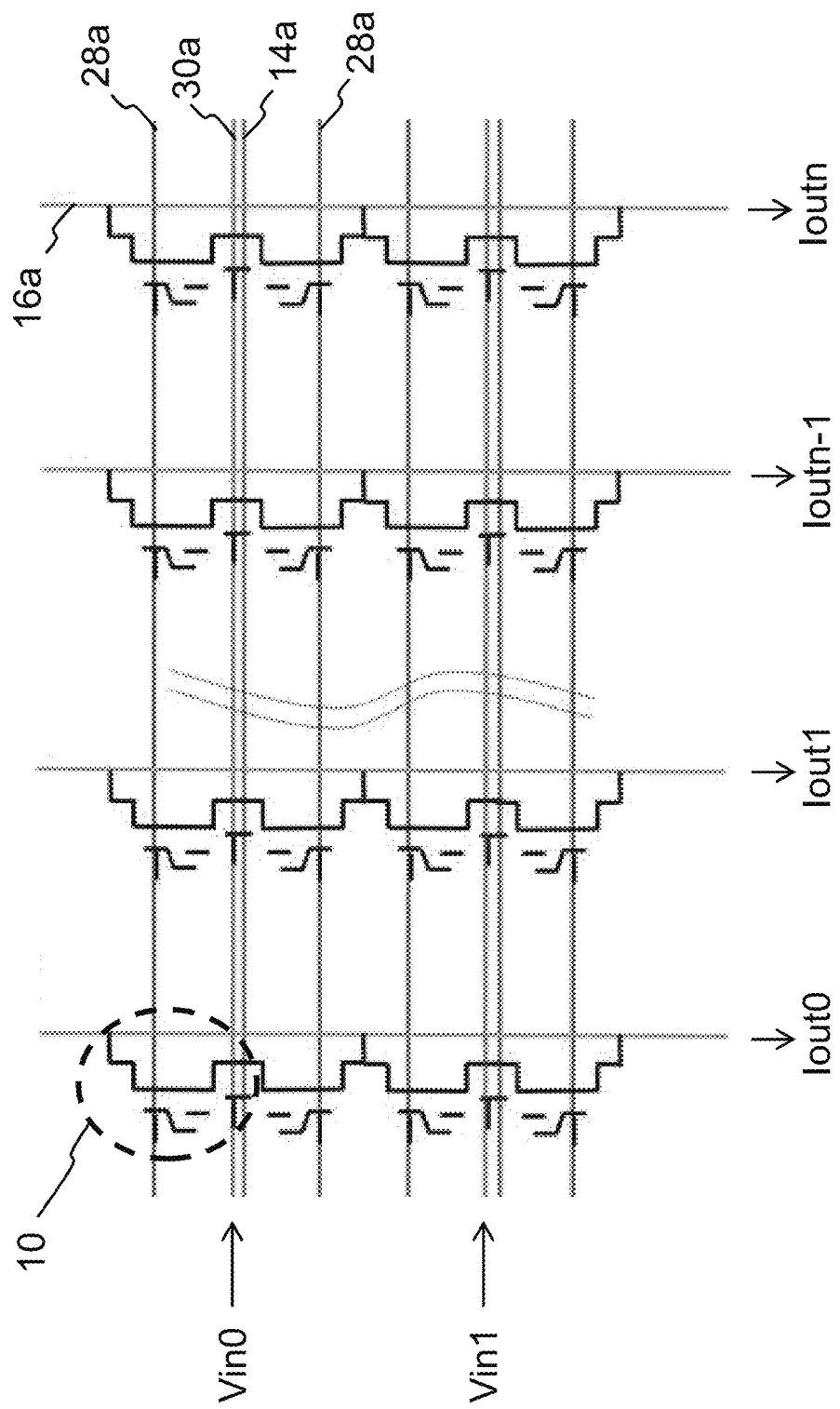
Figure 30:
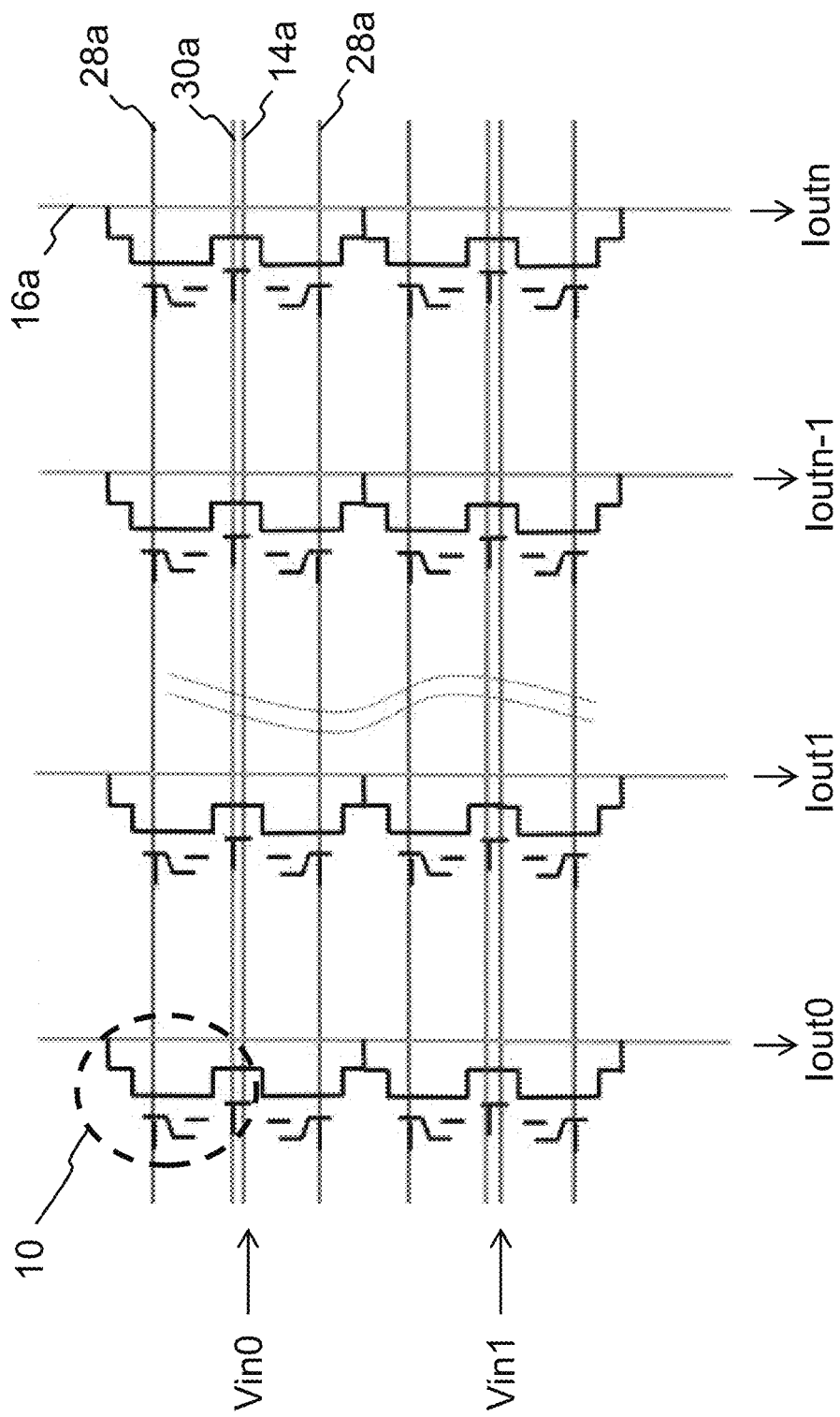
Figure 31:
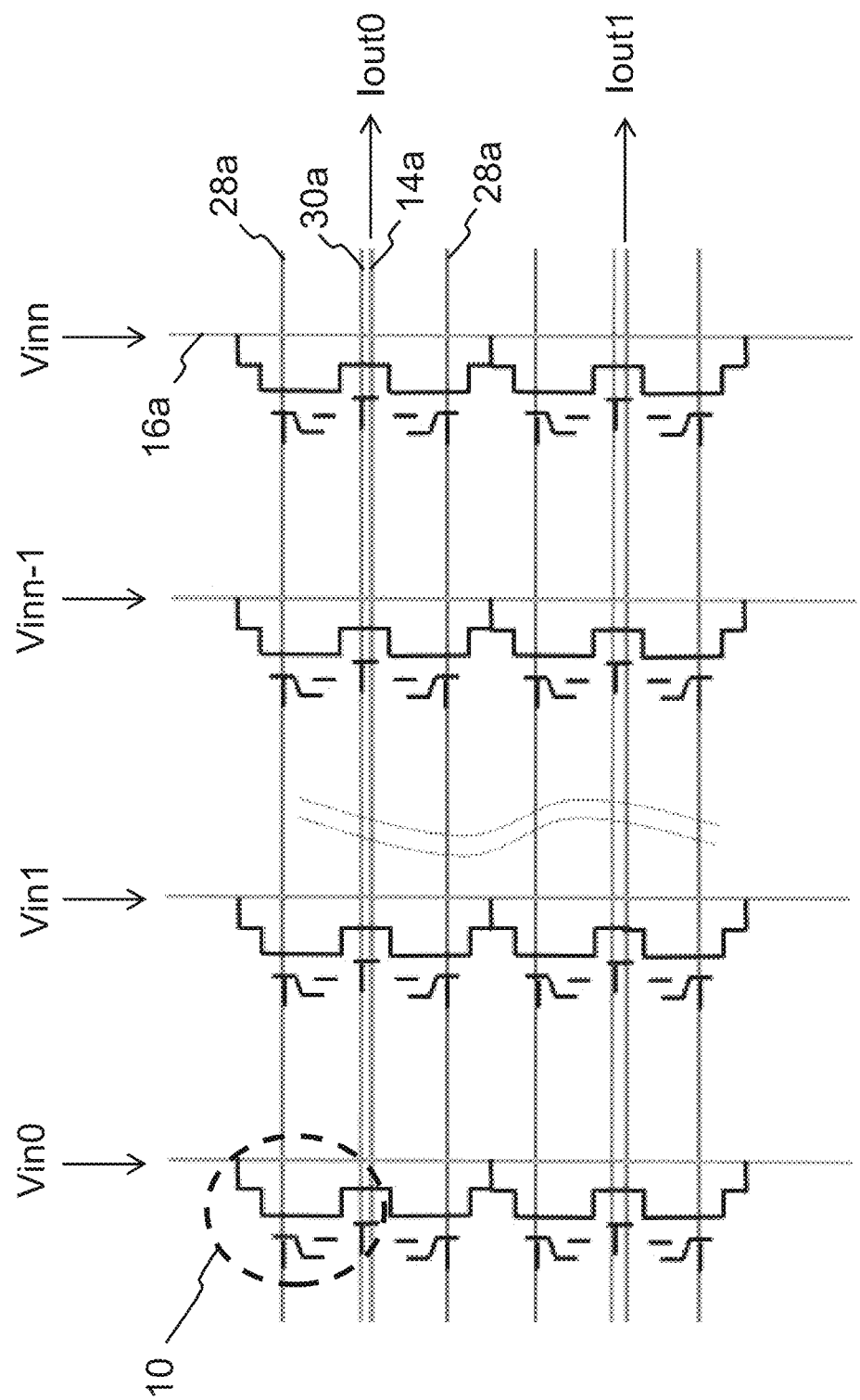

FIG. 28 shows a memory cell array architecture using the memory cell 10 of FIG. 27, with all the lines extending in the horizontal/row direction except the bit lines 16a. After each of the memory cells is programmed with the appropriate weight value for that cell, the array acts as a bit line summing matrix multiplier. The matrix voltage inputs are Vin0-Vin3 and are placed on the select gate lines 28a. The matrix outputs Iout0 . . . Ioutn are produced on the bit lines 16a. Each output Iout is a sum of the cell current that is proportional to the weight W stored in the cell, for all the cells in the column. It should be noted that, for this array architecture, the matrix voltage inputs can be placed on the erase gate lines 30a instead of on the select gate lines 28, as shown in FIG. 29. Alternatively, the matrix inputs could instead be voltage inputs placed on the source lines 14a, instead of voltage inputs placed on the select gate lines 28a or the erase gate lines 30a, as shown in FIG. 30. In yet one more alternative, the matrix inputs could be voltage inputs placed on the bit lines 16a, with the current outputs on the source lines 14a, as shown in FIG. 31.

Figure 32:
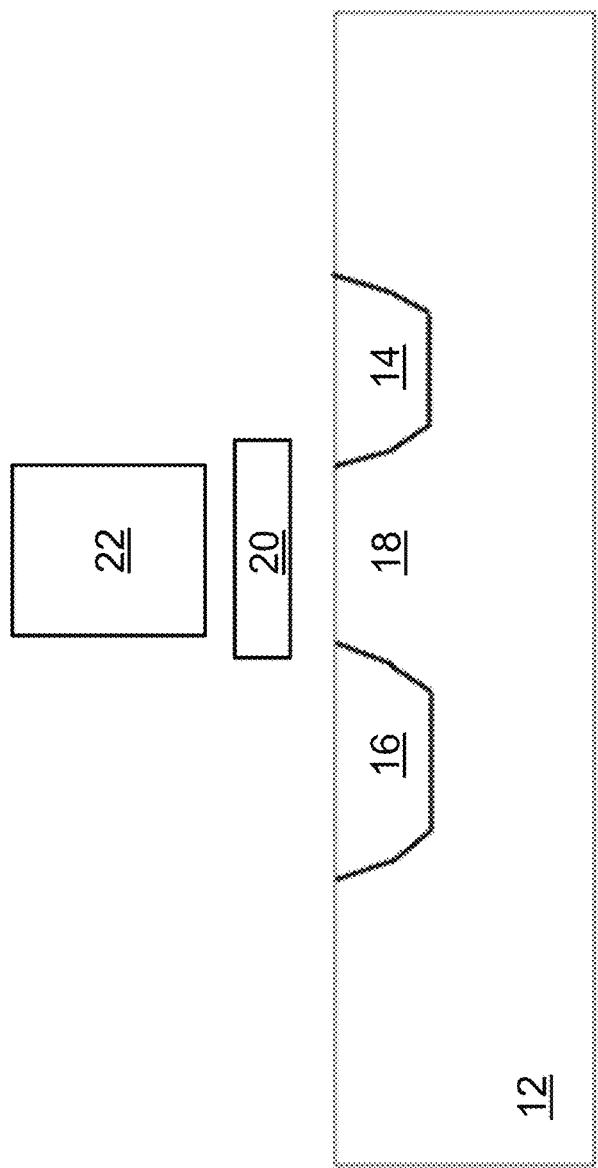
FIG. 32 is a side cross sectional view of a 2-gate non-volatile memory cell.

FIG. 32 shows a memory cell 10 with just two gates in a stacked gate configuration. The memory cell include source and drain regions 14/16, with a channel region 18 there between, as is the case with the above described memory cells. However, with the present memory cell configuration, the floating gate 20 extends over the entire channel region, and the control gate 22 is disposed over the floating gate. This memory cell is programmed with hot electron injection on the source side. Alternative program can be done on the drain side. The memory cell is erased by placing a high positive voltage on the substrate 12, source region 14 or drain region 16, where the electrons tunnel from the floating gate 20 to the substrate 12. This memory cells is read by placing read voltages on the control gate and the source region 14. Exemplary, non-limiting operating voltages can include those in Table 5 below:

TABLE 5

|  | CG 22a | BL 16a | SL 14a | Substrate 12 |
| --- | --- | --- | --- | --- |
| Read 1 | 0-5 V | 0.1-2 V | 0-2 V | 0 V |
| Read 2 | 0.5-2 V | 0-2 V | 2-0.1 V | 0 V |
| Erase | 0 V/-12 V | 0 V | 0 V | 20 V/8 V |
| Program | 5-12 V | ~10-50 uA | 4.5 V | 0 V |

Read 1 is a read mode in which the cell current comes out on the bit line. Read 2 is a read mode in which the cell current comes out on the source line.

Figure 33:
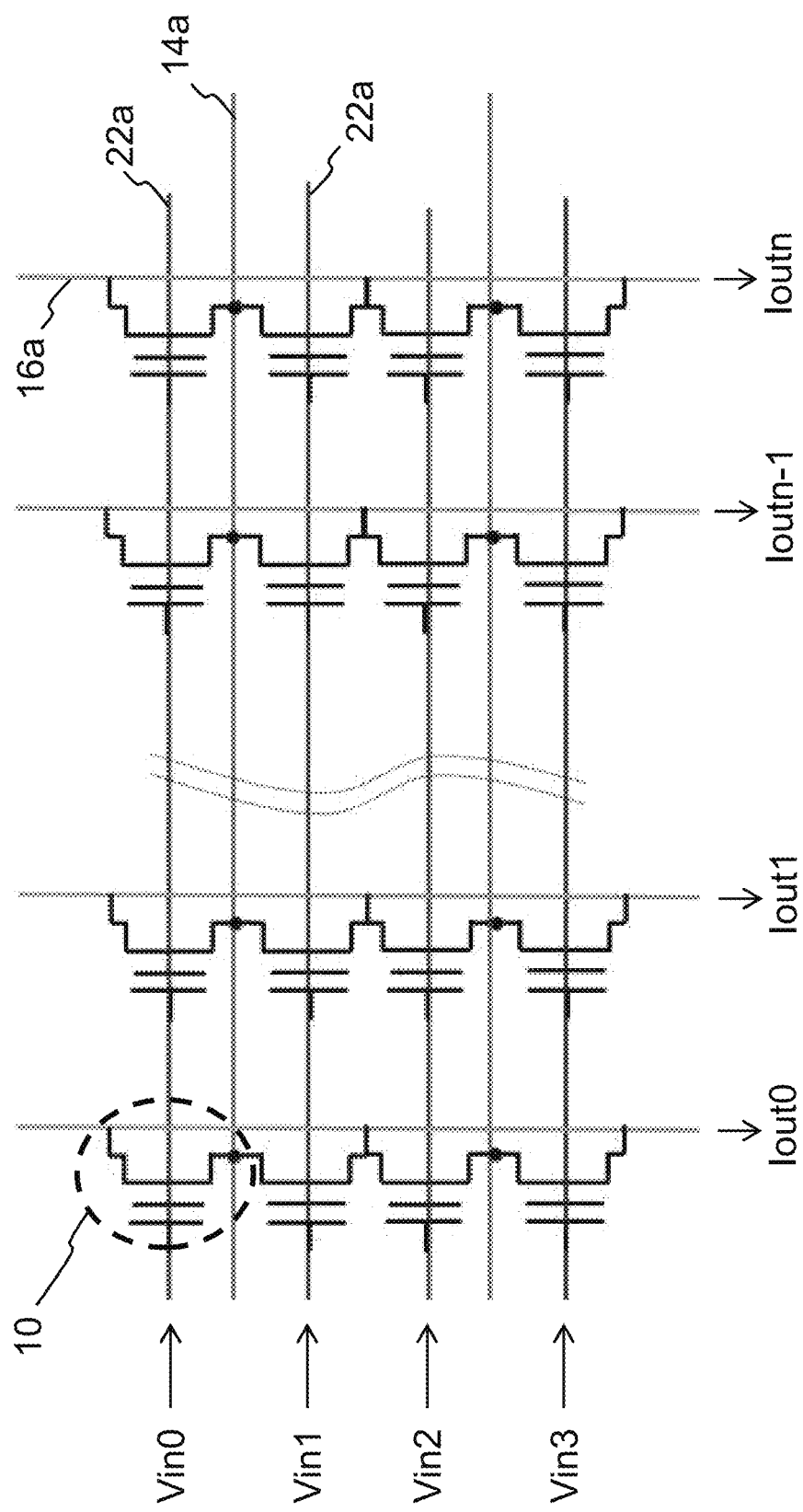
FIGS. 33-39 are schematic diagrams illustrating architectures of arrays of the two-gate memory cell of FIG. 32.
Figure 34:
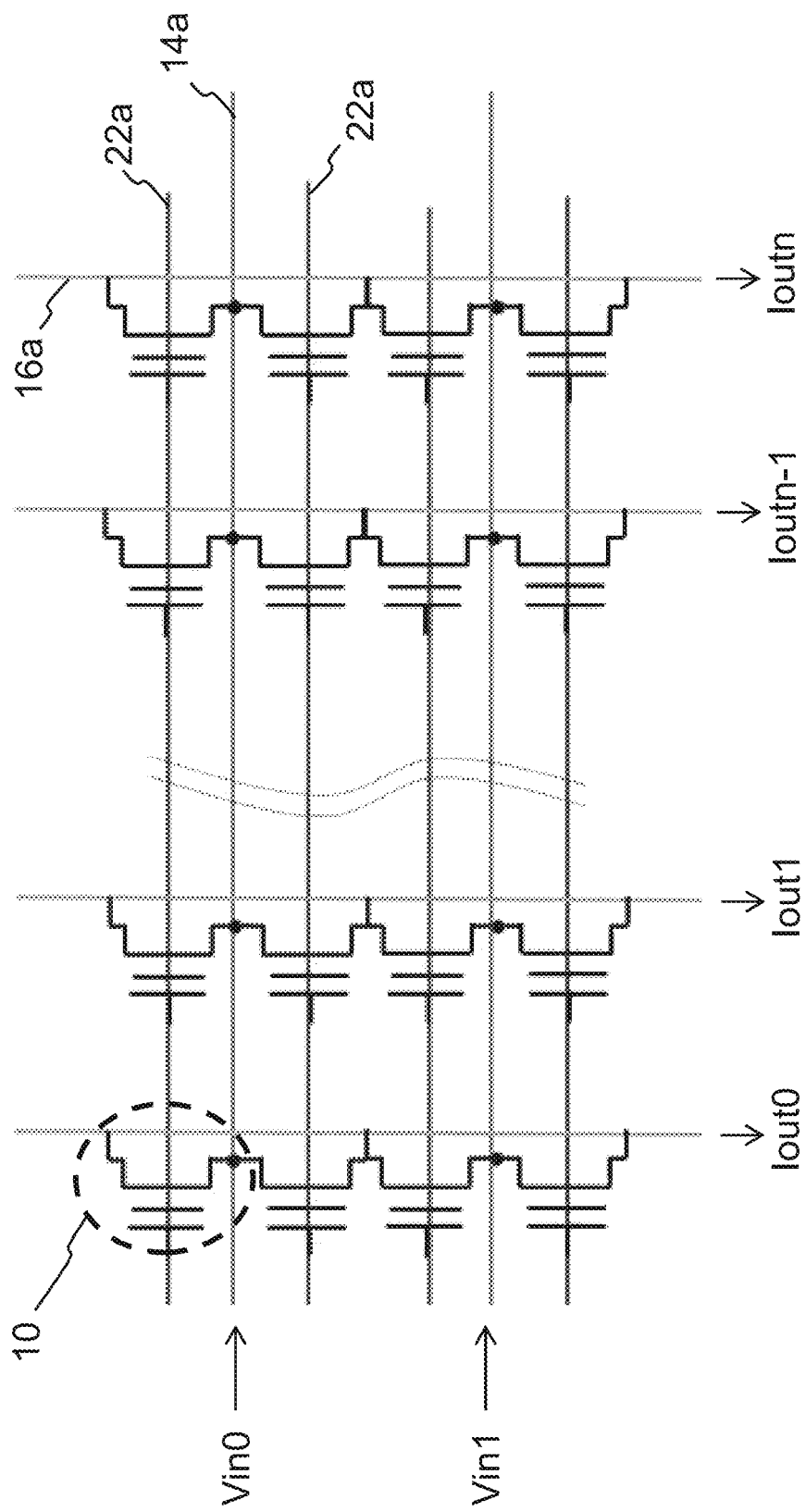
Figure 35:
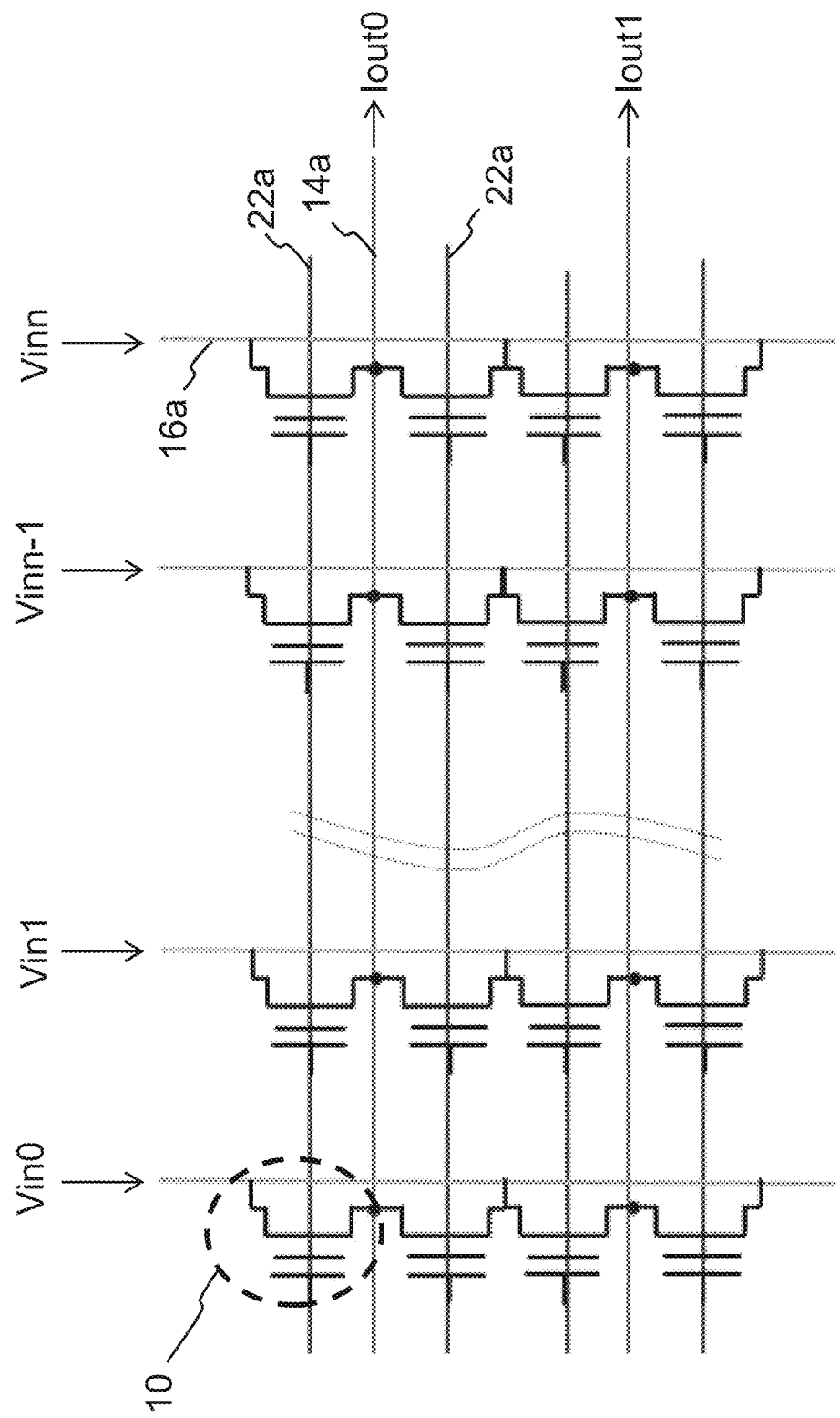

FIG. 33 shows a memory cell array architecture using the memory cells 10 of FIG. 32, with all the lines extending in the horizontal/row direction except the bit lines 16a. After each of the memory cells is programmed with the appropriate weight value for that cell, the array acts as a bit line summing matrix multiplier. The matrix voltage inputs are Vin0-Vin3 and are placed on the control gate lines 22a. The matrix outputs Iout0 . . . Ioutn are produced on the bit lines 16a. Each output Iout is a sum of the cell current that is proportional to the weight W stored in the cell, for all the cells in the column. It should be noted that, for this array architecture, the matrix inputs could instead be voltage inputs placed on the source lines 14a, instead of voltage inputs placed on the control gate lines 22a, as shown in FIG. 34. In yet one more alternative, the matrix inputs could be voltage inputs placed on the bit lines 16a, with the current outputs on the source lines 14a, as shown in FIG. 35.

Figure 36:
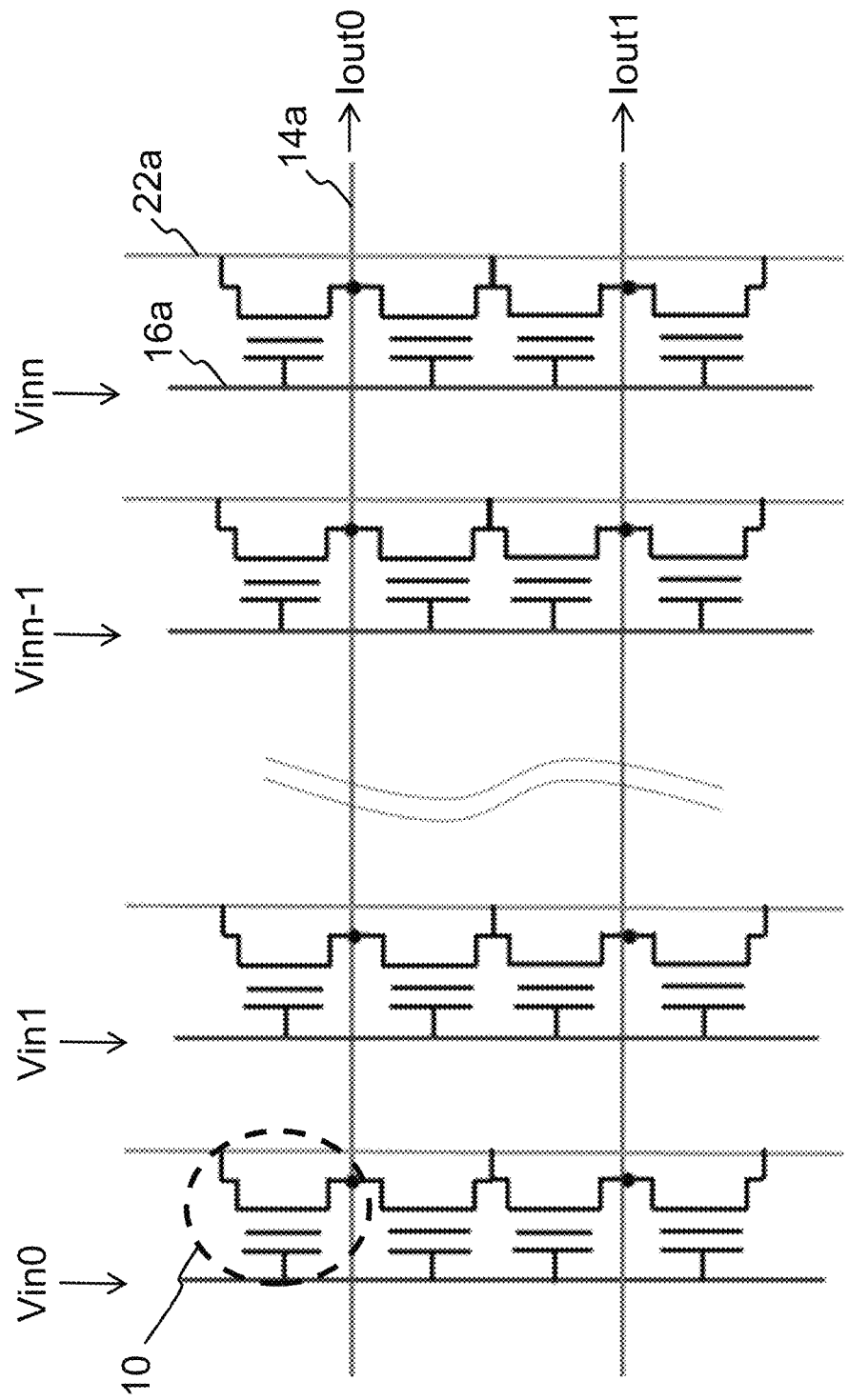

FIG. 36 shows another memory cell array architecture using the memory cells 10 of FIG. 32. The array architecture of FIG. 36 is the same as that of FIG. 33, except that the control gate lines 22a run vertically instead of horizontally (i.e., each control gate line 22a connects together all the control gates 22 for the memory cells in one of the columns). After each of the memory cells is programmed with the appropriate weight value for that cell, the array acts as a source line summing matrix multiplier. The matrix voltage inputs are Vin0-Vin3 and are placed on the control gate lines 22a. The matrix outputs Iout0 . . . Ioutn are produced on the source lines 14a. Each output Iout is a sum of the cell current that is proportional to the weight W stored in the cell, for all the cells in the row.

Figure 37:
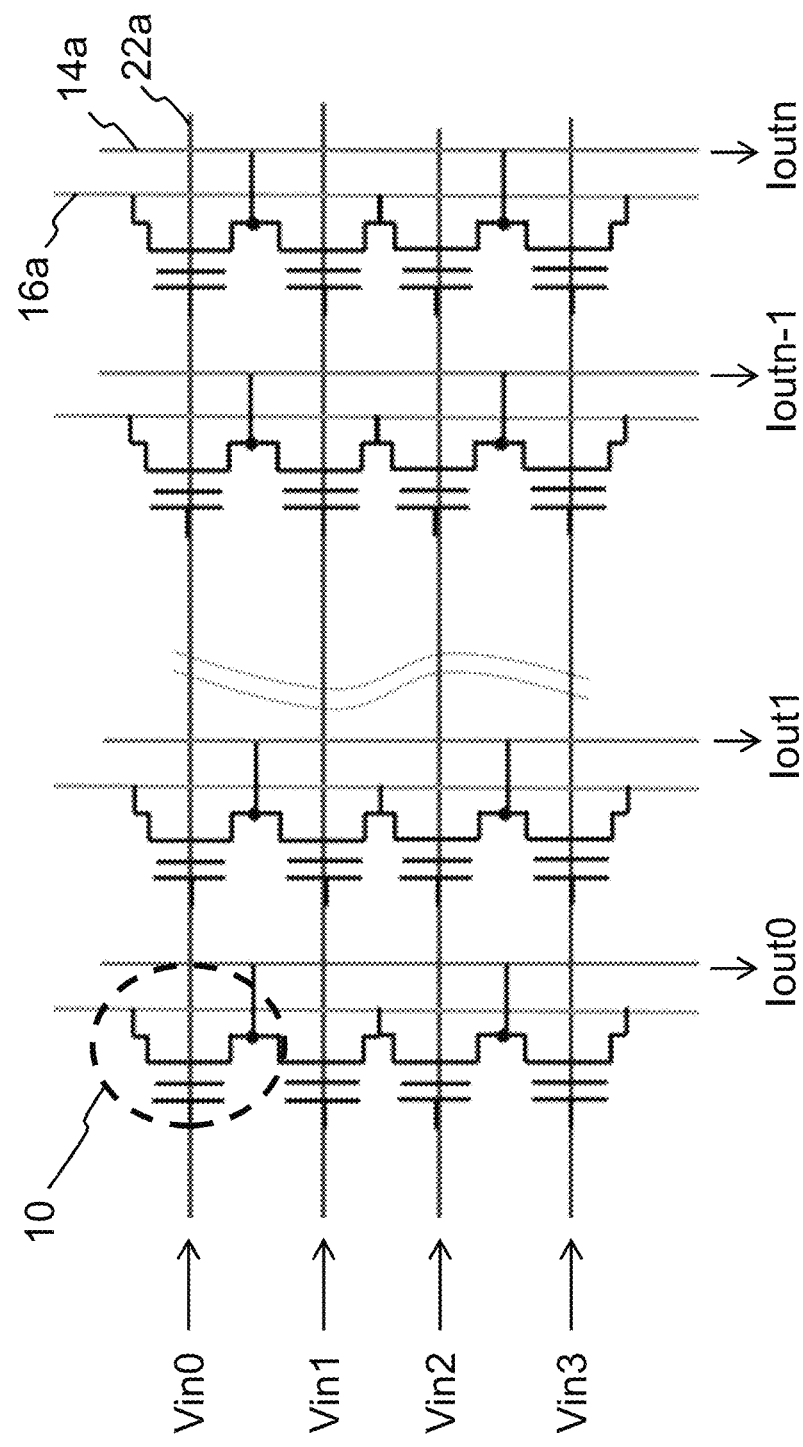
Figure 38:
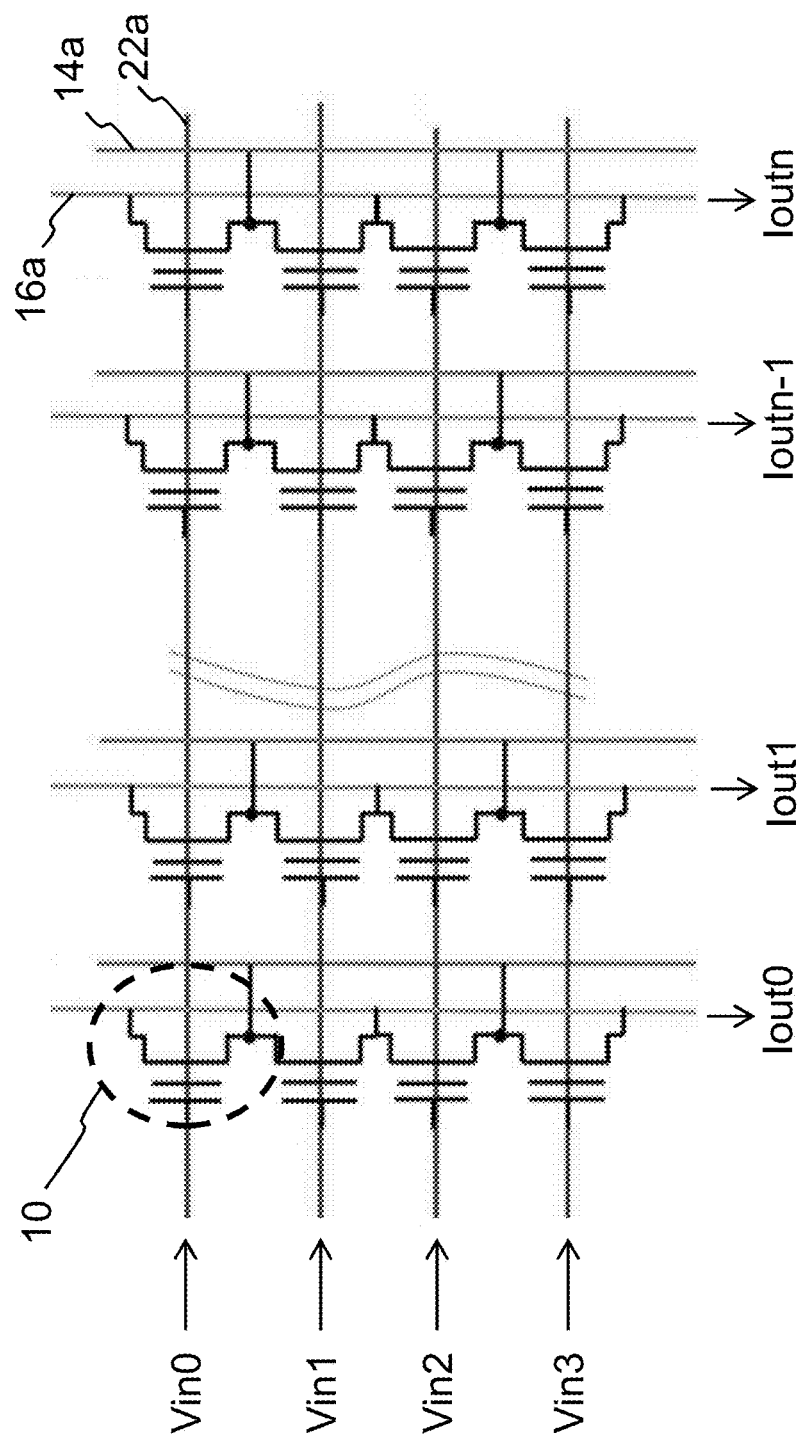

FIG. 37 shows another memory cell array architecture using the memory cells 10 of FIG. 32. The array architecture of FIG. 37 is the same as that of FIG. 33, except that the source lines 14a run vertically instead of horizontally (i.e., each source line 14a connects together all the source regions 14 for the memory cells in one of the columns). After each of the memory cells is programmed with the appropriate weight value for that cell, the array acts as a source line summing matrix multiplier. The matrix voltage inputs are Vin0-Vin3 and are placed on the control gate lines 22a. The matrix outputs Iout0 . . . Ioutn are produced on the source lines 14a. Each output Iout is a sum of the cell current that is proportional to the weight W stored in the cell, for all the cells in the column. Alternatively, the matrix outputs are produced on the bit lines 16a instead of on the source lines 14a, as shown in FIG. 38.

Figure 39:
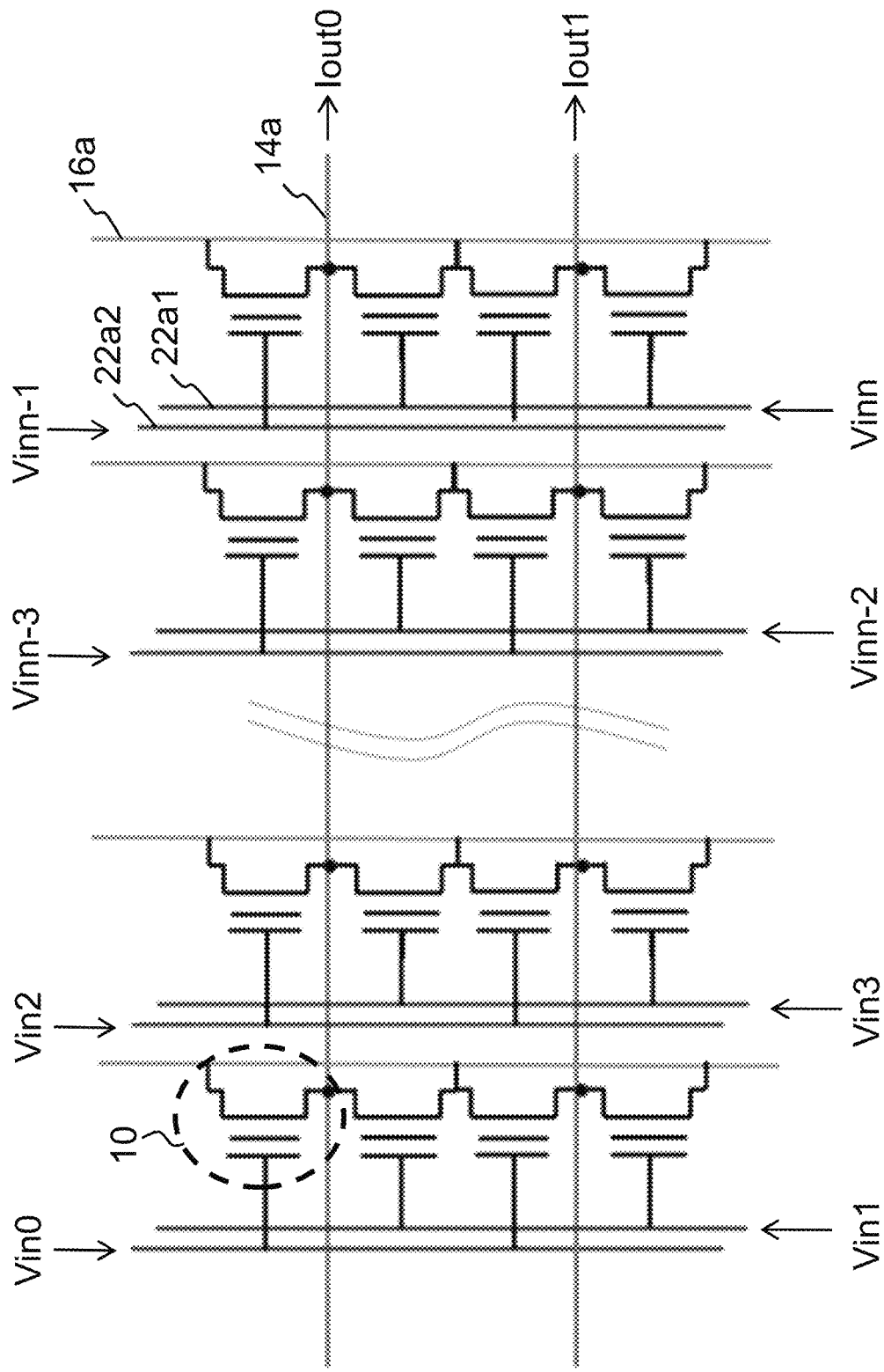

FIG. 39 shows another memory cell array architecture using the memory cells 10 of FIG. 32. The array architecture of FIG. 39 is the same as that of FIG. 36, except that there are two control gate lines 22a for each column of memory cells (i.e., a first control gate line 22a1 connecting together the control gates 22 for all the memory cells in the column in the even rows, and a second control gate line 22a2 connecting together the control gates 22 for all the memory cells in the column in the odd rows. After each of the memory cells is programmed with the appropriate weight value for that cell, the array acts as a source line summing matrix multiplier. The matrix voltage inputs are Vin0-Vinn and are placed on the control gate lines 22a1 and 22a2. The matrix outputs Iout0 . . . Iout2 are produced on the source lines 14a. Each output Iout is a sum of the cell current that is proportional to the weight W stored in the cell, for all the cells in the row. The two inputs for each column can be differential inputs.

All the previously described embodiments can operate the memory cells in an analog or a digital manner, and either below or above the threshold of the memory cells. As used herein, operating in a digital manner means the memory cell can be programmed or erased to represent one of two program states (also referred to as program levels) during operation, for example '0' and '1' represented by a programmed state and an erased state. Operating in an analog manner means the memory cell can be programmed or erased to represent more than just two program states during operation, for example one of 16 program states for a 4-bit equivalent memory cell. Operating above threshold means that the applied read voltage(s) are sufficient to turn the memory cell on (depending upon its program state), meaning that it will conduct current through the channel region (i.e., read current or cell current) in a manner where there is a linear or a saturation relationship between the read voltage(s) and the cell current. Operating below threshold means that the applied read voltage(s) are not sufficient to turn the memory cell strongly on, meaning that any current through the memory cell is considered sub-threshold current. The relationship between read voltage(s) and cell current during sub-threshold operation is not linear, but is predictable and repeatable in an exponential fashion. Therefore, sub-threshold memory cell operation is better suited for extreme low power analog operation, whereas the linear characteristics of operating above threshold are better suited for digital operation for high speed performance. However, for certain applications or for extending the operation range, digital operation below threshold, and/or analog operation above threshold, may be desired.

If the memory cells are operated in an analog manner, network accuracy can be improved by optimizing the program states. Specifically, as discussed above with respect to FIGS. 8A and 8B, the weight level assignments as stored in the memory cells correspond to different program states (including an erased state, which technically is a lowest program state) that the memory cells ideally achieve during mapping (tuning by program or erase) of the weight values into the memory cells, so that the stored weights are properly applied during read operations to the incoming inputs. The different program states reflect different numbers of electrons that are placed on the floating gate, and correspond to the different possible read currents through the channel region given the same applied read operation voltages. The more electrons on the floating gate, the higher the program state (and thus the lower channel read current during a read operation). So, for the 16 program states of FIG. 8A, the L0 state reflects the most erased program state (where the floating gate contains the least amount of electrons). L1 reflects a program state with a first amount of electrons programmed onto the floating gate. L2 reflects a program state with a second amount of electrons programmed onto the floating gate greater than the first amount of electrons, and so on. In this embodiment, the program states are evenly spaced from each other, meaning that, for a given read operation of applied read voltages applied to the memory cell, any two adjacent program states differ from each other by the same difference in read current. Said another way, programming the floating gate with additional electrons to move the memory cell from one programming state to the next programming state would always result in the same amount of decrease in read current for the given read operation of applied read voltages. Alternately, if the read current is converted to a read voltage, then the above equally applies but with respect to read voltage instead of read current. Therefore, as used herein, program state spacing or separation between two program states refers to the difference in read current or read voltage derived from read current under the same read operation conditions of applied read voltages to the memory cell. In contrast, in FIG. 8B, the higher level program states are spaced closer together than are the lower level program states (i.e., the difference in read current or read voltage between adjacent levels of program states is a function of the program state levels, where the differences in read current or read voltage separating adjacent higher levels of program states is less than that for adjacent lower levels of program states).

Figure 41:
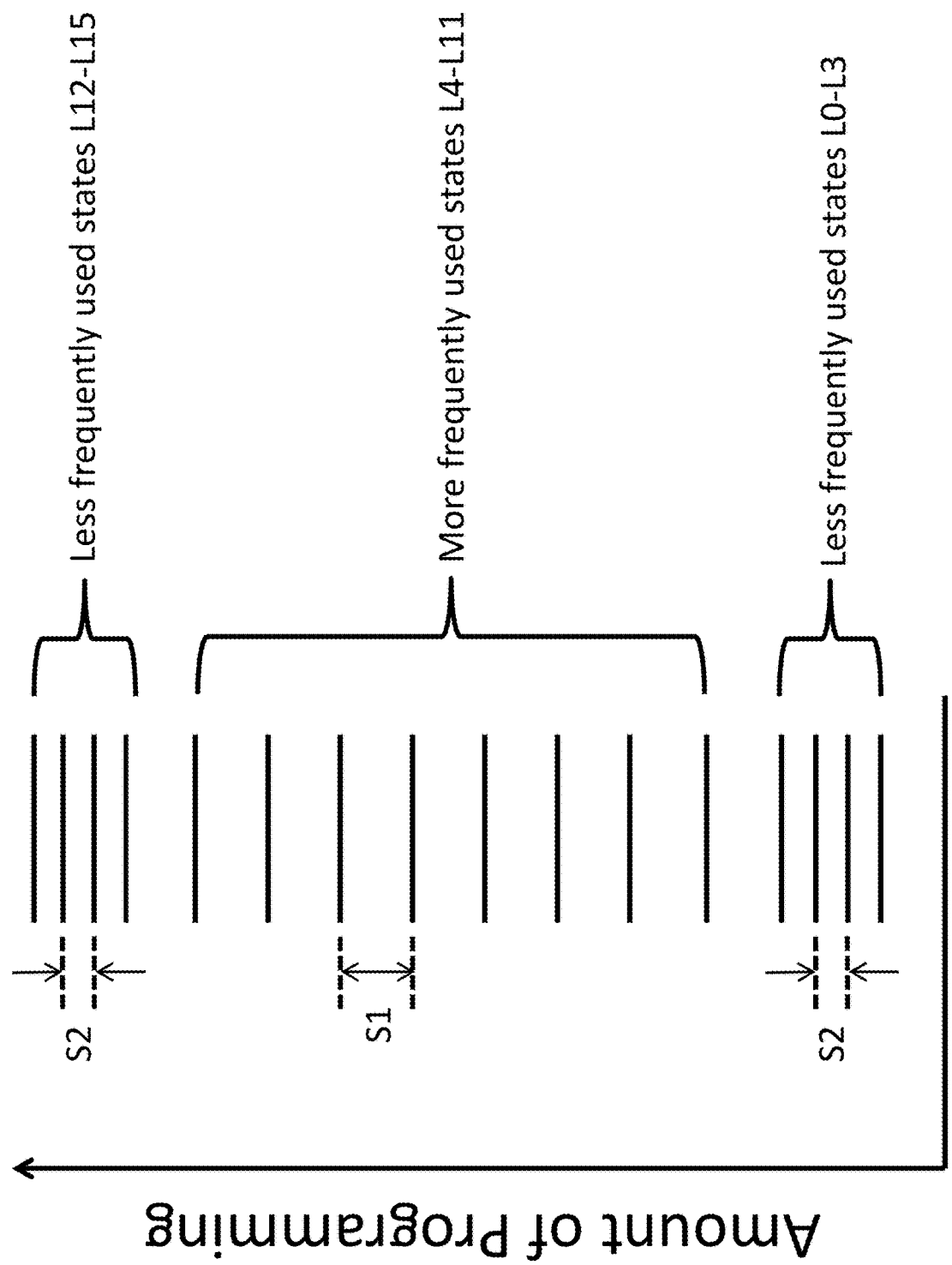
FIGS. 41, 43, 45 and 47 are diagrams illustrating different program state level separation schemes.

It has been discovered that improved neural network system reliability and performance can be achieved by varying the program state separation based upon the density of use of the various program states, instead of merely being based on program state level number. Density of use reflects the relative number memory cells programmed to that program state (i.e. a frequency of use of that program state). The higher the density of use (i.e., the higher the frequency of use) for any given program state, the greater the relative number of memory cells that are programmed to that program state in comparison with the other program states. For example, FIG. 40 shows an exemplary density of use of a system employing 16 program states, where the middle program states are used the most, and the lower and higher program states are used the least. In this example, more memory cells are programmed to the L7 program state than any of the other program states. To increase system reliability and performance, states used the most are set to have a separation from adjacent program states that is greater than that for those program states used a lesser amount. This is shown in FIG. 41, where program states L4-L11 are spaced further apart from each other than are program states L0-L3 and L12-15 (i.e., separation S1 between adjacent states is greater than separation S2 between adjacent states). The greater the program state separation, the better the potential accuracy and reliability that can be achieved, because greater deviations can exist between target and actual tuned state levels during programming while still being able to accurately read the memory cell's program state. Greater tolerances in read inaccuracies can be endured while still accurately reading the memory cells programmed at program states with greater separation. Sources of inaccuracies that can be overcome by greater program separation can include tuning inaccuracy, reading inaccuracy, thermal or 1/f noise, cell to cell coupling, etc.

Figure 43:
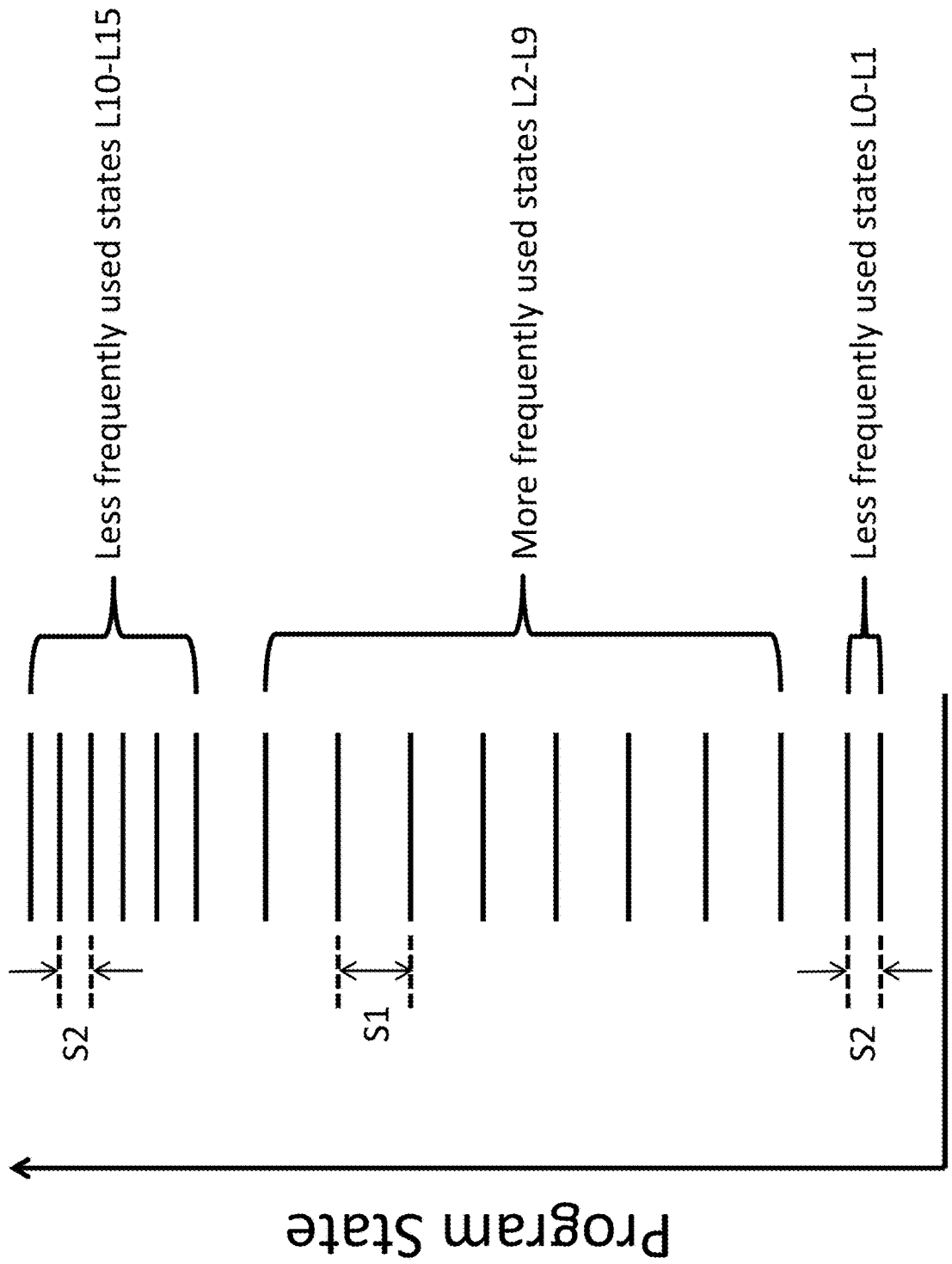

FIGS. 42 and 43 illustrate a different density of use example, where more of the upper program states are used less, and more of the lower program states are used more, relative to that shown in FIGS. 41 and 42. In this example, program states L2-L9 are spaced further apart from each other than are program states L0-L1 and L10-L15. This system favors more of the lower program states with greater separation given they are used more often by the plurality of memory cells.

Figure 44:
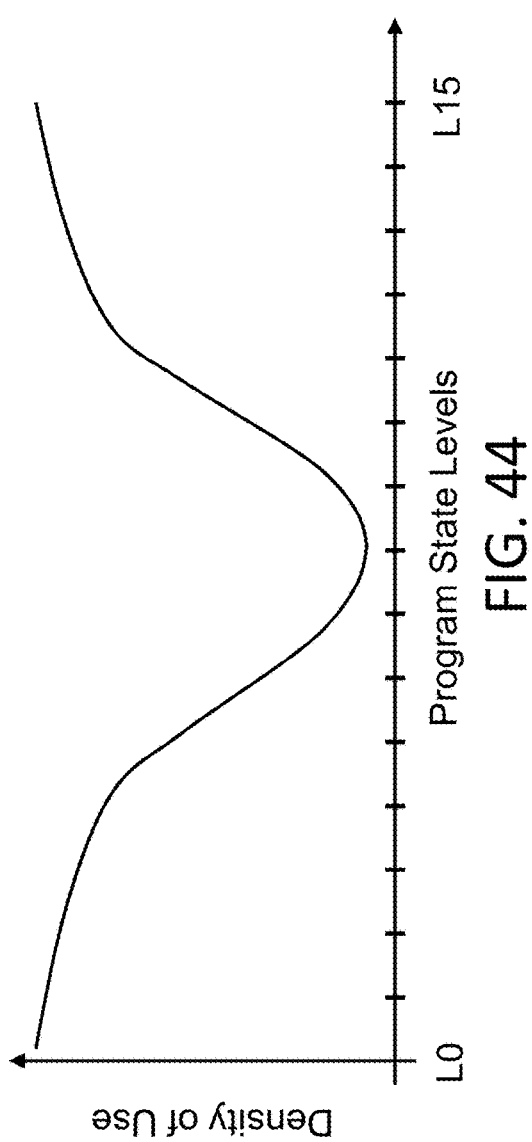
Figure 45:
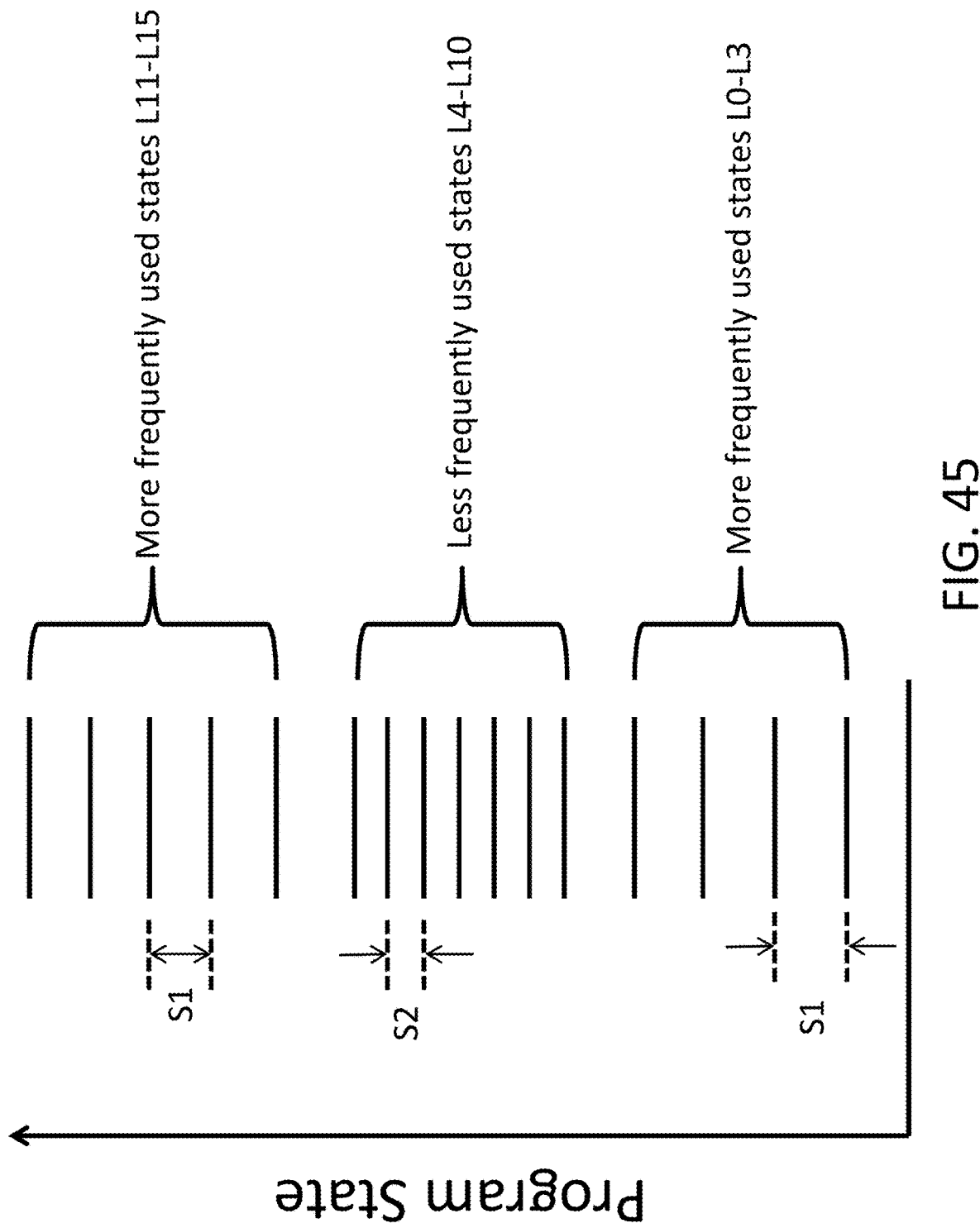

FIGS. 44 and 45 illustrate a different density of use example, where it is the middle program states that are used the least. In this example, program states L0-L3 and L11-L15 are spaced further apart from each other relative to program states L4-L10. This system favors lower and upper program states over the middle program states with greater separation given they are used more often by the plurality of memory cells.

Figure 46:
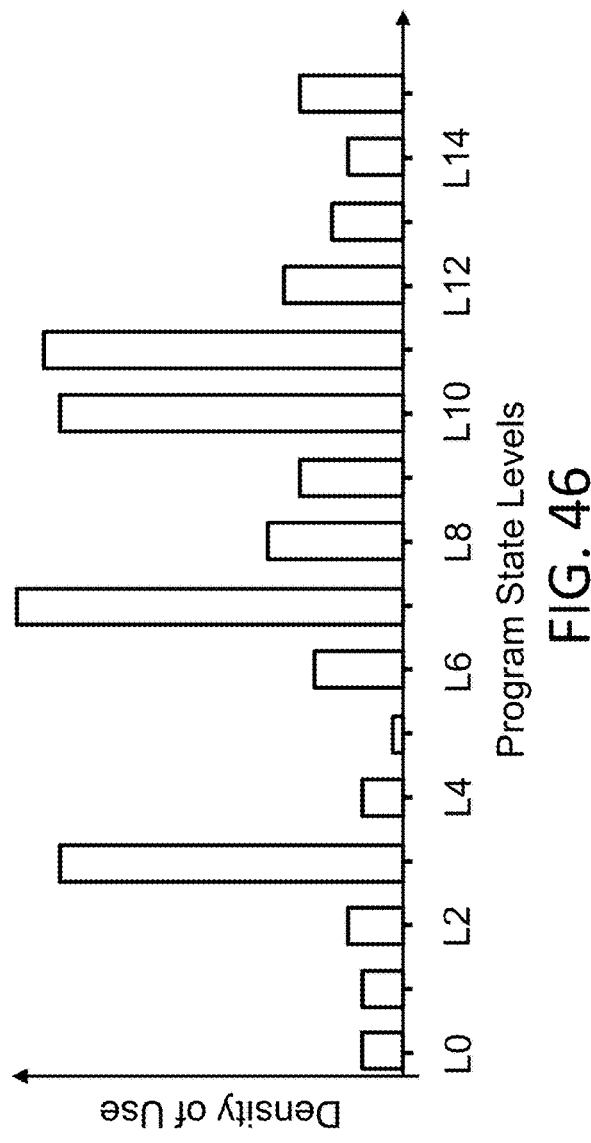
Figure 47:
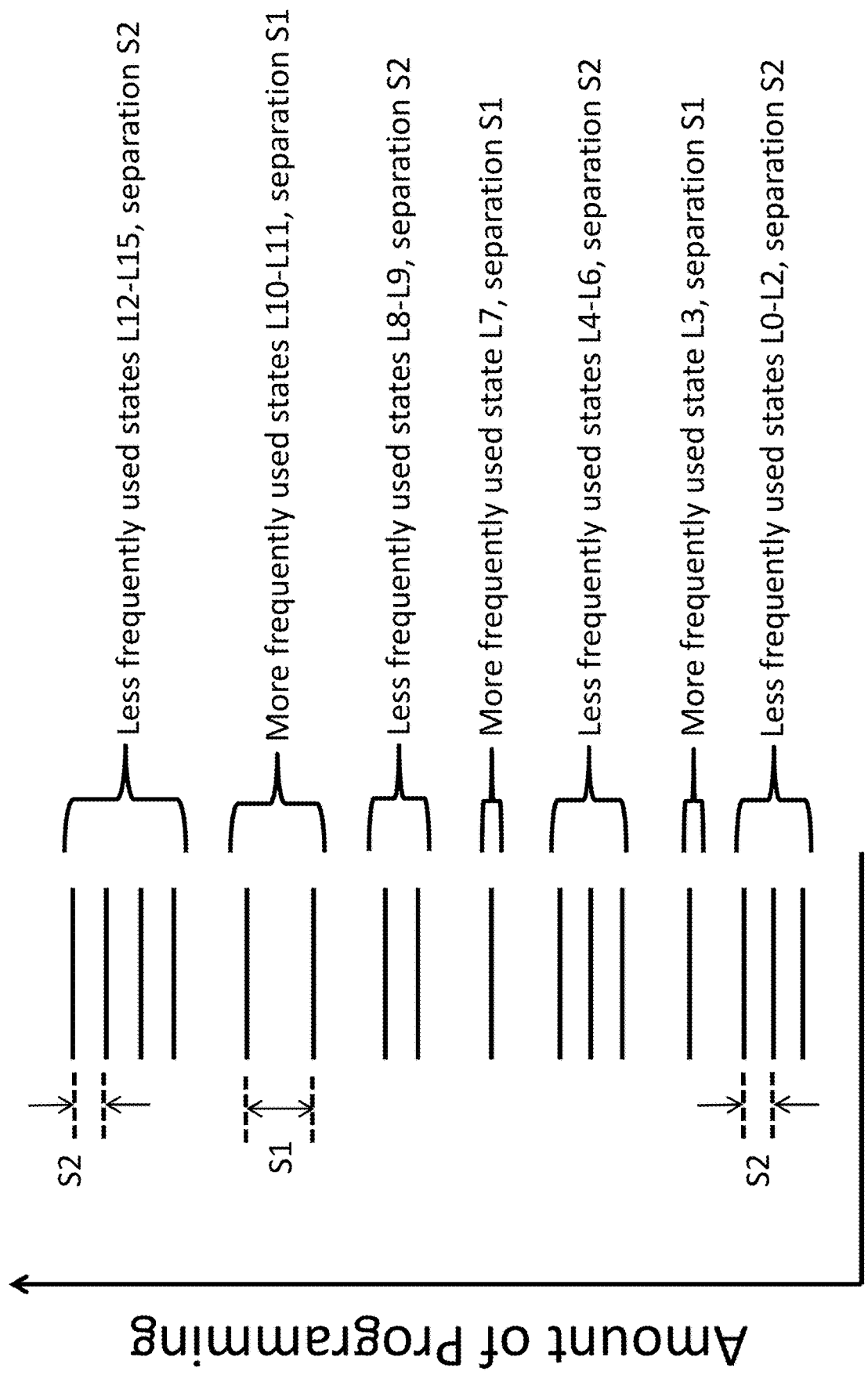

FIGS. 46 and 47 illustrate a different density of use example, where the program states with a higher density of use (L3, L7, L10, and L11) are not all adjacent to each other. The embodiment reflects that the density of use can be considered individually, program state by program state. In another embodiment, where certain program states affect the accuracy of the neural network the most, those program states are spaced further apart.

It should be noted that while the separation between adjacent program states are shown to be either S1 or S2, more than two separation values can be used, and/or the separation can be varied among just the less frequently used states and/or among just the more frequently used states.

Further, one way to implement changes in separation is that S1 separation is logarithmic and S2 separation is linear, or vice versa. Alternatively, S1 and S2 can be different amounts of logarithmic difference.

Density of use can be determined, for example, during neural network training. Such training can include providing the neural network with known inputs to achieve desired outputs. Actual outputs are then compared to the desired outputs to determine errors, which are used to adjust the stored weights to improve the system outputs until the desired outputs are achieved or the system reaches some statistically desired point. As part of this training, the density of use of the various program states are determined, and used to adjust program state separation as discussed above. The density of use can be determined and implemented on a global basis for multiple levels collectively, or more individually down to a layer by layer basis. Other techniques for determining density of use can include creating a forecast model that estimates which weights (and therefore which program states) are used the most based on the particular application or based on historical information.

The type of operation (digital versus analog), and/or the program state separation scheme, can be the same or varied as a function of neural net layer in order to maximize performance in terms of speed, accuracy, reliability, power consumption, etc. For example, two different adjacent or non-adjacent neural net layers can use two different operation modes (one operating digitally and the other operating in an analog fashion) or the same operation mode. Additionally or alternatively, some VMM arrays can operate below threshold while others operate above threshold. Also, two different adjacent or non-adjacent neural net layers operating in an analog fashion can utilize different program state separation schemes, and/or utilize a different number of program states (i.e., if a given neural net layer needs fewer program states, then fewer program states that are spaced further apart can be used), or use the same program state separation schemes. As a specific example, in FIG. 12, the synapses in CB2 going from layer S1 to layer C2 can be operated digitally, while the synapses in CB3 (going from layer S2 and layer C3) and in CB4 (going from layer C3 to layer S3) can be operated in analog fashion. Additionally, some of the neural net layers in CB2 can operate using the program state separation scheme of FIG. 41 using 16 levels, while others operate using the program state separation scheme of FIG. 8 using just 8 levels. Additionally or alternatively, some of the neural net layers in CB2 can operate using the program state separation scheme of FIG. 41 (with the middle states spaced further apart than the other program states), while others operate using the program state separation scheme of FIG. 45 (with the middle states spaced closer together than the other program states).

Performance can be enhanced by using VMM arrays that operate differently (digital versus analog, above or below threshold, greater/fewer analog programming states, etc.) given the purpose and needs of each neural net layer. For example, operating the memory cells below threshold (subthreshold) reduces power consumption (e.g., current from hundreds of nano-amps down to below one pico-amp), and is therefore better for extreme low power analog operation. Operating the memory cells above threshold consumes more power (e.g., current from hundreds of nano-amps to tens of micro-amps) but offers characteristics that are better suited for digital operation, higher operating range, more state levels due to higher current, and high speed performance. Operating the memory cells in a digital manner provides more flexibility for different machine learning (deep learning) operations such as convolution, pooling, non-linear functions, but would consume more power. Operating memory cells in an analog manner is less flexible but consumes less (e.g., could be one tenth or even one hundredth of the power consumed by memory cells operating digitally). Therefore, the operation of each VMM array can be set (digital/analog, above or below threshold, program state separation scheme, etc.) to maximize performance of that neural net layer, which can the same or be varied relative to other VMM arrays.

Another example of how performance can be further enhanced by using VMM array that operate or are configured differently, either alone or in combination with one or more of the above described varied types of VMM array operation, is by using an analog volatile VMM array in combination with an analog non-volatile VMM as described above. Such an analog volatile VMM array is formed of volatile memory cells (e.g. DRAM, SRAM, capacitor based custom memory cell, etc. that lose their stored information when power is turned off to the memory cell, as opposed to non-volatile memory cells such as those having a floating gate where their stored information is maintained even after power is turned off to the memory cell), and can be used as convolution layers. For example, the weights of the filters are stored in an analog non-volatile array as described above. These weights are then transferred to the analog volatile VMM array, where the convolution is then operated on the analog volatile VMM array. One advantage of doing so would be the increased speed of using volatile memory cells (which operate faster than non-volatile memory cells), yet the stored weights are maintained in the non-volatile memory cells after power is turned off. A VMM array of volatile memory cells is more flexible for different machine learning (deep learning) operations, but also needs to be refreshed more frequently (e.g., typically in the milliseconds timeframe) and therefore consumes more power. A VMM array of non-volatile memory cells is less flexible for different machine learning (deep learning) operations, but needs to be refreshed less frequently (e.g., typically in the months or years timeframe) and therefore consumes less power. Therefore, for any given application, multiple layers of volatile VMM arrays, and/or multiple layers of non-volatile layers, may be used, depending on the requirements of each VMM layer and a balance of the above described advantages and disadvantages of volatile and non-volatile VMM arrays.

Figure 48:
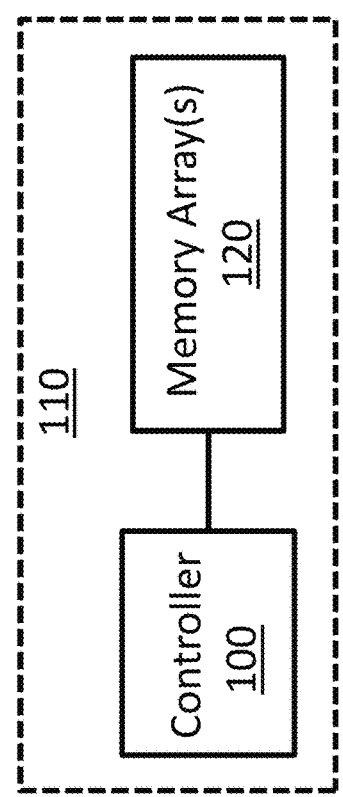
FIG. 48 is a diagram illustrating a controller on the same chip as the memory array(s) for implementing the operation of the memory array(s).

All of the above functionality can be performed under the control of a controller 100 containing control circuitry which is connected to the memory array(s) of the above described memory cells 10 used for the neural net functionality. As shown in FIG. 48, the controller 100 is preferably on the same semiconductor chip or substrate 110 as the memory array(s) 120. However, controller 100 could also be located on a separate semiconductor chip or substrate, and could be a collection of multiple controllers or disparate control circuitry disposed in different locations on or off semiconductor chip or substrate 110.

Some neural net applications use both positive and negative weights, in which case the controller 100 maps the negative weights to some of the program states and the positive weights to others of the program states when the memory cells are programmed with the weights. Then, during operation, the controller 100 will perform the appropriate action for the output current generated from the memory cells programmed with the negative weights.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Single layers of material could be formed as multiple layers of such or similar materials, and vice versa. While the outputs of each memory cell array are manipulated by filter condensation before being sent to the next neuron layer, they need not be. Lastly, for each of the matrix multiplier array embodiments described above, for any lines not being used for the input voltages or the output currents, the nominal read voltages disclosed in the tables herein for that configuration of memory cell can be (but not necessary be) applied to those lines during operation.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A memory device, comprising:
   a plurality of memory cells;
   a controller configured to:
      program each of the memory cells to one of a plurality of program states, read the memory cells using a read operation of applied voltages to the memory cells,
      wherein during the read operation, separations between adjacent ones of the program states vary based on frequencies of use of the program states in the plurality of memory cells.

2. The memory device of claim 1, wherein for each of the plurality of program states, the controller is configured to:
   determine the frequency of use of the program state in the plurality of memory cells, and
   set the separation between the program state and an adjacent one of the program states based upon the determined frequency of use.

3. The memory device of claim 2, wherein the controller is configured to set the separation for a first of the program states having a first frequency of use and to set the separation for a second of the program states having a second frequency of use that is greater than the first frequency of use, wherein the separation for the second of the program states is greater than the separation for the first of the program states.

4. The memory device of claim 2, wherein the controller is configured to set the separations for a first group of the program states to a first value, and to set the separations for a second group of the program states to a second value greater than the first value, wherein each of the second group of the program states has a frequency of use greater than that of any of the first group of the program states.

5. The memory device of claim 1, wherein the plurality of memory cells are non-volatile memory cells.

6. A neural network device, comprising:
a first plurality of synapses configured to receive a first plurality of inputs and to generate therefrom a first plurality of outputs, wherein the first plurality of synapses comprises:
a plurality of memory cells;
a controller configured to:
program each of the memory cells to one of a plurality of program states,
read the memory cells using a read operation of applied voltages to the memory cells,
wherein during the read operation, separations between adjacent ones of the program states vary based on frequencies of use of the program states in the plurality of memory cells;
the plurality of memory cells are configured to generate the first plurality of outputs based upon the first plurality of inputs and the plurality of program states; and
a first plurality of neurons configured to receive the first plurality of outputs.

7. The neural network device of claim 6, wherein for each of the plurality of program states, the controller is configured to:
determine the frequency of use of the program state in the plurality of memory cells, and
set the separation between the program state and an adjacent one of the program states based upon the determined frequency of use.

8. The neural network device of claim 7, wherein the controller is configured to set the separation for a first of the program states having a first frequency of use and to set the separation for a second of the program states having a second frequency of use that is greater than the first frequency of use, wherein the separation for the second of the program states is greater than the separation for the first of the program states.

9. The neural network device of claim 7, wherein the controller is configured to set the separations for a first group of the program states to a first value, and to set the separations for a second group of the program states to a second value greater than the first value, wherein each of the second group of the program states has a frequency of use greater than that of any of the first group of the program states.

10. The neural network device of claim 6, further comprising:
a second plurality of synapses configured to receive a second plurality of inputs from the first plurality of neurons and to generate therefrom a second plurality of outputs, wherein the second plurality of synapses comprises:
a plurality of second memory cells;
the controller configured to:
program each of the second memory cells to one of a plurality of second program states,
read the second memory cells using a second read operation of second applied voltages to the second memory cells,
wherein during the second read operation, separations between adjacent ones of the second program states vary based on frequencies of use of the second program states in the plurality of second memory cells;
the plurality of second memory cells are configured to generate the second plurality of outputs based upon the second plurality of inputs and the plurality of second program states; and
a second plurality of neurons configured to receive the second plurality of outputs.

11. The neural network device of claim 10, wherein for each of the plurality of second program states, the controller is configured to:
determine the frequency of use of the second program state in the plurality of second memory cells, and
set the separation between the second program state and an adjacent one of the second program states based upon the determined frequency of use.

12. The neural network device of claim 11, wherein the controller is configured to set the separation for a first of the second program states having a third frequency of use and to set the separation for a second of the second program states having a fourth frequency of use that is greater than the third frequency of use, wherein the separation for the second of the second program states is greater than the separation for the first of the second program states.

13. The neural network device of claim 11, wherein the controller is configured to set the separations for a first group of the second program states to a third value, and to set the separations for a second group of the second program states to a fourth value greater than the third value, wherein each of the second group of the second program states has a frequency of use greater than that of any of the first group of the second program states.

14. The neural network device of claim 10, wherein values of the separations between adjacent ones of the program states are different than values of the separations between adjacent ones of the second program states.

15. The neural network device of claim 10, wherein a total number of the plurality of program states is different than a total number of the plurality of second program states.

16. The neural network device of claim 10, wherein the memory cells are volatile and the second memory cells are non-volatile, or the memory cells are non-volatile and the second memory cells are volatile.

17. The neural network device of claim 10, wherein the plurality of memory cells are non-volatile memory cells and wherein the plurality of second memory cells are non-volatile memory cells.

18. A method of programming memory cells, comprising:
programming each of a plurality of memory cells to one of a plurality of program states;
reading the memory cells using a read operation of applied voltages to the memory cells,
determining a frequency of use for each of the program states in the plurality of memory cells; and
for each of the program states, setting a separation between the program state and an adjacent one of the program states during the read operation based upon the determined frequency of use for the program state.

19. The method of claim 18, wherein the setting further comprises:
setting the separation for a first of the program states having a first frequency of use; and setting the separation for a second of the program states having a second frequency of use that is greater than the first frequency of use;

wherein the separation for the second of the program states is greater than the separation for the first of the program states.

20. The method of claim 18, wherein the setting further comprises:

setting the separations for a first group of the program states to a first value; and setting the separations for a second group of the program states to a second value greater than the first value;

wherein each of the second group of the program states has a frequency of use greater than that of any of the first group of the program states.

21. A neural network device, comprising:

a first plurality of synapses configured to receive a first plurality of inputs and to generate therefrom a first plurality of outputs, wherein the first plurality of synapses comprises:

a plurality of first memory cells;

a controller configured to:

program each of the first memory cells to one of a plurality of first program states, and read the first memory cells using a read operation of applied voltages to the first memory cells, the plurality of first memory cells are configured to generate the first plurality of outputs based upon the first plurality of inputs and the plurality of first program states; and a first plurality of neurons configured to receive the first plurality of outputs;

a second plurality of synapses configured to receive a second plurality of inputs from the first plurality of neurons and to generate therefrom a second plurality of outputs, wherein the second plurality of synapses comprises:

a plurality of second memory cells;

the controller configured to:

program each of the second memory cells to one of a plurality of second program states, read the second memory cells using a second read operation of second applied voltages to the second memory cells, the plurality of second memory cells are configured to generate the second plurality of outputs based upon the second plurality of inputs and the plurality of second program states; and a second plurality of neurons configured to receive the second plurality of outputs;

wherein at least one of:

a total number of the plurality of first program states is different than a total number of the plurality of second program states, a total number of the plurality of first program states is only two and a total number of the plurality of second program states greater than two, or a total number of the plurality of first program states is greater than two and a total number of the plurality of second program states only two, the first memory cells are volatile and the second memory cells are non-volatile, or the first memory cells are non-volatile and the second memory cells are volatile, the first memory cells and the second memory cells are non-volatile, the controller is configured perform the first read operation above threshold and the second read operation below threshold, or perform the first read operation below threshold and the second read operation above threshold, and the controller is configured perform the first read operation and the second read operation above threshold, or perform the first read operation and the second read operation below threshold.

22. The neural network device of claim 21, wherein a total number of the plurality of first program states is different than a total number of the plurality of second program states.

23. The neural network device of claim 21, wherein a total number of the plurality of first program states is only two and a total number of the plurality of second program states greater than two, or a total number of the plurality of first program states is greater than two and a total number of the plurality of second program states only two.

24. The neural network device of claim 21, wherein the first memory cells are volatile and the second memory cells are non-volatile, or the first memory cells are non-volatile and the second memory cells are volatile.

25. The neural network device of claim 21, wherein the first memory cells and the second memory cells are non-volatile.

26. The neural network device of claim 21, wherein the controller is configured perform the first read operation above threshold and the second read operation below threshold, or perform the first read operation below threshold and the second read operation above threshold.

27. The neural network device of claim 21, wherein the controller is configured perform the first read operation and the second read operation above threshold, or perform the first read operation and the second read operation below threshold.

* * * * *